United States Patent
Funaba et al.

(10) Patent No.: US 6,628,538 B2
(45) Date of Patent: Sep. 30, 2003

(54) MEMORY MODULE INCLUDING MODULE DATA WIRINGS AVAILABLE AS A MEMORY ACCESS DATA BUS

(75) Inventors: Seiji Funaba, Kokubunji (JP); Yoshinobu Nakagome, Hamura (JP); Masashi Horiguchi, Koganei (JP); Yoji Nishio, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/105,249

(22) Filed: Mar. 26, 2002

(65) Prior Publication Data

US 2002/0101755 A1 Aug. 1, 2002

Related U.S. Application Data

(63) Continuation of application No. 09/803,148, filed on Mar. 12, 2001, now Pat. No. 6,438,014.

(30) Foreign Application Priority Data

Mar. 10, 2000 (JP) ........................................ 2000-072484

(51) Int. Cl.[7] .............................. G11C 5/06; H05K 7/02
(52) U.S. Cl. ........................... 365/63; 365/51; 361/777; 361/778; 361/803
(58) Field of Search ............................... 365/51–52, 63, 365/230.03; 361/737, 760, 777, 778, 783, 803

(56) References Cited

U.S. PATENT DOCUMENTS 6,097,883 A * 8/2000 Dell et al. .................. 361/679
6,111,757 A * 8/2000 Dell et al. .................. 361/737
6,388,886 B1 * 5/2002 Tobita ......................... 365/51

FOREIGN PATENT DOCUMENTS

| JP | 5-234355 | 9/1993 |
| JP | 6-150085 | 5/1994 |
| JP | 7-261892 | 10/1995 |
| JP | 7-334415 | 12/1995 |

* cited by examiner

*Primary Examiner*—Son Mai
(74) *Attorney, Agent, or Firm*—Antonelli, Terry, Stout & Kraus, LLP

(57) ABSTRACT

A module substrate has a plurality of module data terminal pairs individually provided in association with respective chip data terminals in a plurality of memory chips, and a plurality of module data wirings which respectively connect between the plurality of module data terminal pairs. The plurality of module data wirings are connected to their corresponding chip data terminals and are configured so as to be available as a memory access data bus. In a memory system in which a plurality of memory modules are arranged in parallel, module data wirings of each individual memory modules are connected in serial form, and each individual module data wirings do not constitute branch wirings with respect to a data bus on a motherboard of the memory system. In the memory modules, parallel access for the number of bits corresponding to the width of the memory access data bus is assured.

9 Claims, 31 Drawing Sheets

FIG. 26A
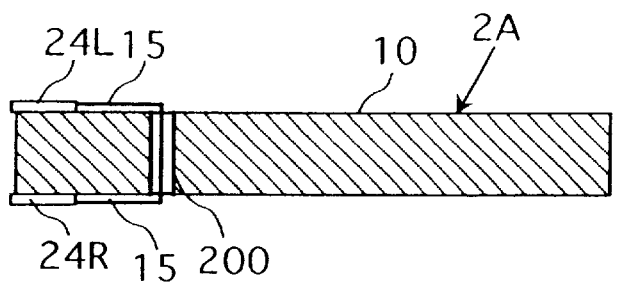
FIG. 26B
FIG. 26C
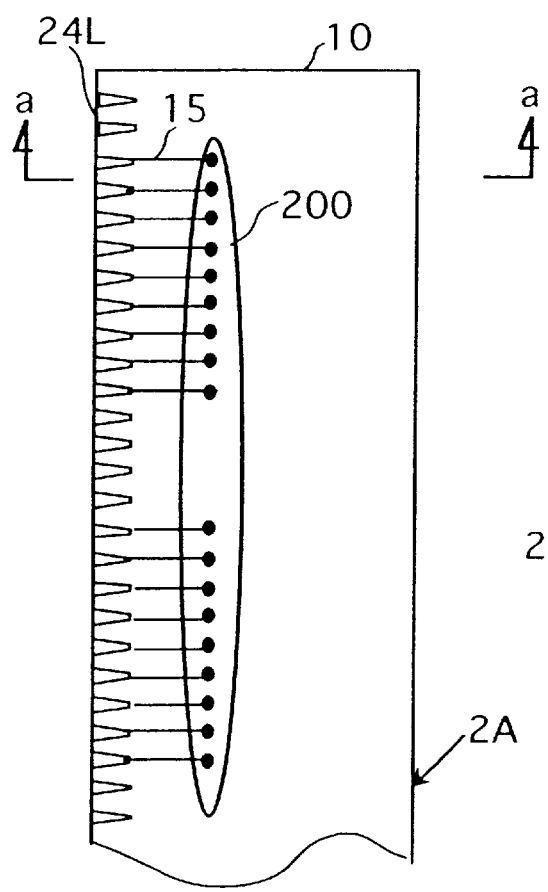
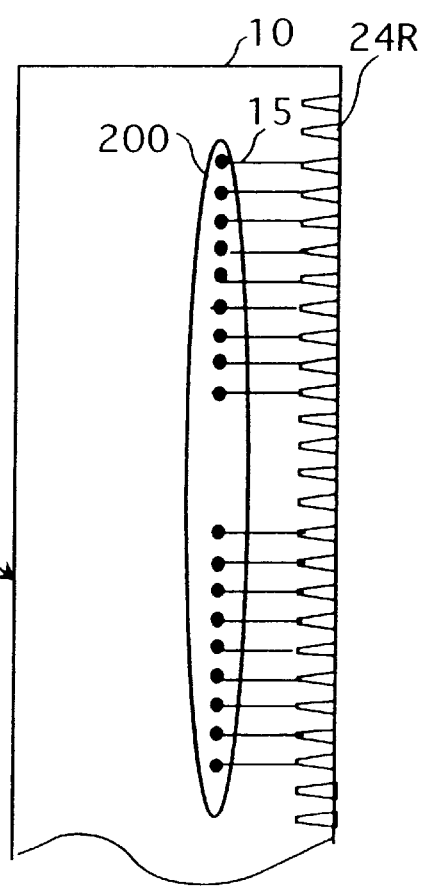

FIG. 44
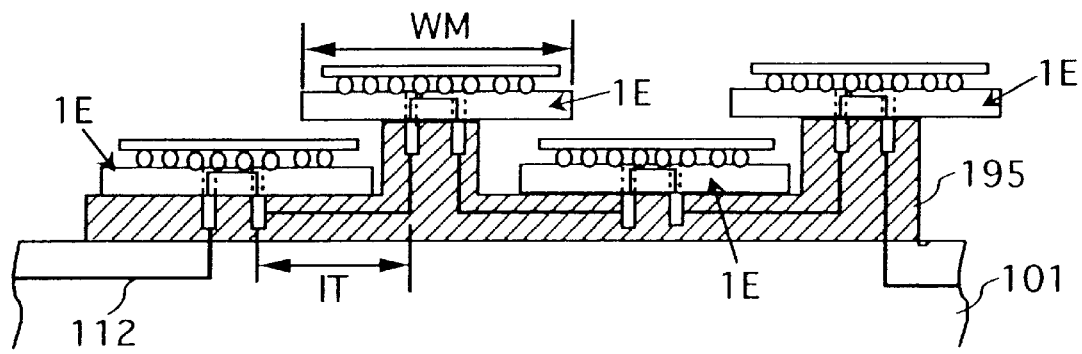
FIG. 45
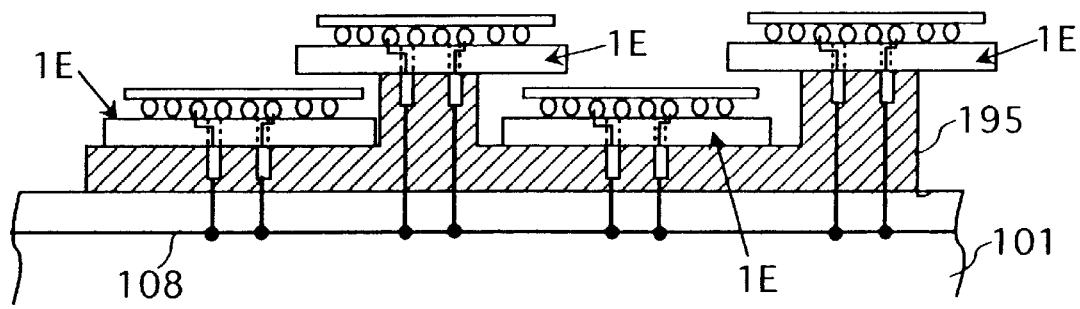
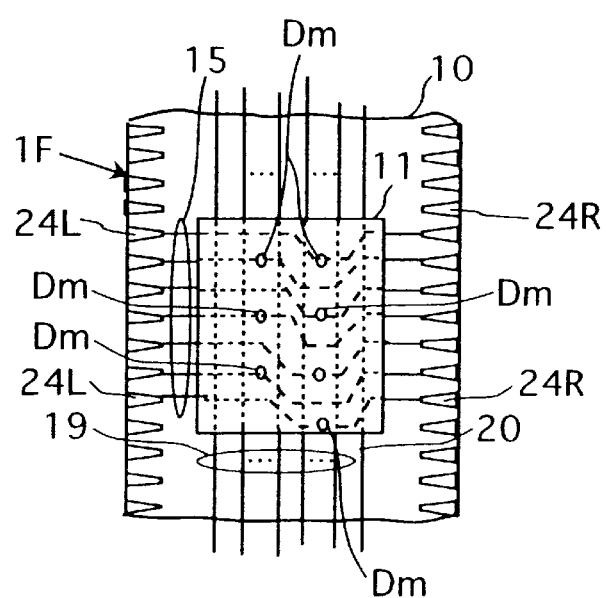
FIG. 46

MEMORY MODULE INCLUDING MODULE DATA WIRINGS AVAILABLE AS A MEMORY ACCESS DATA BUS

This is a continuation of parent application Ser. No. 09/803,148, filed Mar. 12, 2001, now U.S. Pat. No. 6,438,014 the entire disclosure of which is hereby incorporated by reference.

BACKGROUND OF THE INVENTION

The present invention relates to a technology capable of controlling the reflection of a transmission signal, which is caused by branch wirings (stub) in a memory module, and to a technology effective for application to a high-speed access-compatible memory module.

SSTL (Stub Series Terminated Transceiver Logic) has been known as a small-amplitude interface intended for a memory module. The SSTL has been described in, for example, English Paper Journal, VOL. E82-C, NO. 3, Yasuhiro KONISHI, et al., "Interface technologies for Memories and ASICs-Review and Future Direction", issued by the Institute of Electronics, Information and Communication Engineers, March 1999.

A memory system using SSTL principally comprises a memory controller, signal wirings, connectors and memory modules mounted on a motherboard. The memory modules respectively have m memory chips provided on both surfaces of a module substrate. Data terminals of each individual memory chips are connected to their corresponding module data terminals in m units. Access control data terminals such as address terminals of the memory chips are connected to their corresponding module access control terminals. One-sided ends of the signal wirings are connected to their corresponding signal terminals of the memory controller, and the other ends thereof are terminated into a predetermined voltage. A plurality of memory modules are connected in parallel with their corresponding signal wirings through the connectors. Assuming now that the number of data terminals of each memory chip is defined as n and the number of the memory chips placed on the one side of each memory module is defined as m, the present memory system has m×n data signal wirings. The m memory chips placed on the one side of one memory module of plural memory modules are selected for one access according to a chip select signal generated by the memory controller. The ends or terminals of the signal wirings are connected to a terminal voltage through terminating resistors. Stub resistors for the memory controller are respectively series-connected to signal wirings for connecting the memory controller and the connectors.

Here, module wirings for connecting the module terminals of each memory module and the terminals of each memory chip constitute wirings which branch off from the signal wirings of the motherboard through the connectors. Stub resistors are placed in these module wirings. These stub resistors serve as matching loads for relaxing signal reflection developed in the signal wirings. Mismatching is generally developed in characteristic impedance at each wiring branch point. It is thus necessary to provide the stub resistors for relaxing the mismatching. Assuming that the characteristic impedance of each wiring is defined as $Z0$ and the characteristic impedance of each stub wiring is defined as $Zs0$, $Zs$—$Z0/2$ is suitable as the resistance value of each stub resistor. There is however the possibility that when the resistance value of the stub resistor increases, a voltage drop developed across the resistor will become great, thereby attenuating signal voltages such as addresses, data or the like and hence causing an error in a memory operation. When the resistance value of the stub resistor is less reduced to avoid the attenuation of the signal voltage for this season, there is the possible that signal reflection will become obvious in reverse and hence a signal waveform will disturb, thereby causing a malfunction in the same manner as described above. As the operation is made fast to increase a signal frequency and each branch wiring against which countermeasures are to be taken by the stub resistor, becomes long, the disturbance of a signal waveform at a receiving end becomes great.

On the other hand, the present inventors have discussed, as another memory system, a type wherein a plurality of memory modules are series-connected via connectors to their corresponding signal wirings connected to a memory controller on a motherboard. The present inventors have discussed a configuration wherein on a memory module, a plurality of memory chips are connected by one-stroke writable wiring paths through data signal wirings. Assuming that the number of data signal terminals of each memory element is defined as n in the present memory system, n module data signal wirings are provided therein regardless of the number m of memory elements placed on one side of each memory module, and one memory chip of the plural memory chips is selected for one access.

In another memory system referred above, all the memory modules are series-connected to their corresponding signal wirings of the motherboard, and the module signal wirings lying within the memory modules are series-connected to all the memory chips arranged in a line and are laid along the longitudinal direction of each memory module. Thus, a problem decreases that as in the case of the SSTL, the memory modules little form the branch wirings with respect to the signal wirings on the motherboard, and the disturbance of each waveform due to undesired signal reflection caused by the branch wirings occurs.

However, the present inventors have revealed that the length of the signal wiring increases, and the time necessary for the signal to propagate from the memory controller to the corresponding memory chip at the farthest end thereof becomes long, thus increasing a delay in access time.

Thus, a problem arises in that the module wirings of each memory module constitute the branch wirings on the memory system in the case of the SSTL type, whereby the malfunction due to the signal reflection caused thereby occurs and the speeding up of the memory operation is limited. Since such branching for the signal wiring as developed in the SSTL little exists in the memory module of such a type that the memory chips are connected in series, the branch wiring-based problem decreases. However, the present inventors have revealed the possibility that an increase in the length of the signal wiring lying within each memory module will cause a delay in access time and cannot cope with higher-speed access.

After the completion of the invention of the present application, the inventors of the present application have recognized the following examples known to date. Japanese Patent Application Laid-Open Nos. Hei 5(1993)-234355 and 6(1994)-150085 respectively have disclosed the invention wherein connectors are provided at both long-side portions of each memory module so that the plural memory modules can be connected in tandem. However, they do not disclose a wiring structure provided inside each memory module. Japanese Patent Application Laid-Open No. Hei 7(1995)-334415 discloses a memory module having extended connectors which allow cascade connections of extended memory modules. Japanese Patent Application Laid-Open No. Hei 7(1995)-261892 discloses the invention wherein each of memory modules is provided with inlet connectors and outlet connectors, a memory bus on the memory module connects between them, and memory elements are connected in series with the memory bus, whereby undesired signal reflection is controlled. However, the first through third known examples merely provide the technology of the cascade-connectable memory modules. The fourth known example merely shows the system for connecting the plural memory elements to their corresponding memory bus on each memory module in series form. Any of the examples does not provide the conception leading to the invention of the present application.

SUMMARY OF THE INVENTION

The present invention aims to provide a memory module capable of controlling the disturbance of a signal waveform due to signal reflection to improve the reliability of signal transmission and restraining an increase in access time.

The above, other objects and novel features of the present invention will become apparent from the description of the present specification and the accompanying drawings.

Summaries of typical ones of the inventions disclosed in the present application will be explained in brief as follows:

[1] A memory module comprises a module substrate, and a plurality of memory chips mounted on the module substrate and respectively having a plurality of chip data terminals. The module substrate has a plurality of module data terminal pairs individually provided in association with the respective chip data terminals included in the plurality of memory chips, and a plurality of module data wirings which respectively connect between the plurality of module data terminal pairs. The plurality of module data wirings are connected to their corresponding chip data terminals and are configured so as to be available as a memory access data bus.

Since the module data wirings on the memory module constitute the memory access data bus in the memory module, the module data wirings of the respective memory modules are connected in sequential form in a memory system in which a plurality of memory modules are connected in series. Further, each individual module data wirings do not constitute branch wirings with respect to the data bus on the motherboard of the memory system. Thus, such signal reflection as caused by branching to the data bus on the motherboard of the memory system is not developed. Further, since the chip data terminals are directly connected to the module data wirings on each memory module, such signal reflection as caused by branching to the module data wirings is also developed. In the memory module, parallel access for the number of bits corresponding to the width of the memory access data bus is assured. Thus, the disturbance of each signal waveform due to the signal reflection is restrained while an increase in access time is being controlled, thereby to allow an increase in reliability of signal transmission.

The standpoint that the plurality of module data wirings are regarded as the single memory access data bus, can be grasped from the viewpoint that the plurality of memory chips are chip-selected and controlled on a parallel basis.

Various forms may be adopted as specific forms of module data terminal pairs and module data wirings. Firstly, when the plurality of memory chips may be arranged along the longitudinal direction of the module substrate, the module data terminal pairs are placed at one long-side portions and the other long-side portions of each individual memory chip-mounted surfaces of the module substrate. In other words, the module data wirings may be caused to extend from one long-side portion of each memory chip-mounted surface of the module substrate to the other long-side portion thereof. In a further viewpoint, the plurality of module data wirings may be grasped as those respectively have lengths each substantially equal to the length of the short side of the module substrate. Thus, the length of each module data wiring becomes consequentially short and the parasitic capacitance of each wiring and the resistance thereof are reduced.

Secondly, when the plurality of memory chips are arranged along the longitudinal direction of the module substrate, the module data terminal pairs may be placed at one long-side portion of the module substrate. Described specifically, the module data wirings are formed in the same wiring layer on a return or reciprocating basis and connected to their corresponding module data terminal pairs. Further, the module data wirings are formed in mutually-different wiring layers brought into conduciton through holes defined between the wiring layers and are connected to their corresponding module data terminal pairs.

Thirdly, the memory chips may be placed on both surfaces of the module substrate so as to constitute each memory module.

[2] A memory module comprises a module substrate, and a plurality of memory chips mounted along the longitudinal direction of the module substrate and respectively having a plurality of chip data terminals and a plurality of chip address terminals. The module substrate has a plurality of module data terminal pairs individually provided in association with the respective chip data terminals included in the plurality of memory chips, module address terminal pairs common to the plurality of memory chips, a plurality of module data wirings which respectively connect the plurality of module data terminal pairs in linear form, and module address wirings which connect the module address terminal pairs in linear form and which extend in intersecting directions and are commonly connected to the chip address terminals of the plurality of memory chips. The plurality of module data wirings are connected to their corresponding chip data terminals.

According to the above means, the disturbance of each signal waveform due to signal reflection is restrained while an increase in access time is being controlled, thereby to allow an increase in reliability of signal transmission in the same manner as described above. In particular, this contributes to the shortening of the lengths of the module data wiring and the module address wiring.

The module address wirings extend in directions orthogonal to the linear wiring portions for connecting the module address terminal pairs and distribute address signals to their corresponding chip address terminals of the plural memory chips. Therefore, if address buffer circuits are interposed in the module address wirings and configured in parts as first module address wirings which connect the module address terminal pairs in linear form and are connected with input terminals of the address buffer circuits, and second module address wirings which are commonly connected to the plural chip address terminals from output terminals of the address buffer circuits and are respectively placed in directions orthogonal to the first module address wirings, it is then possible to restrain the formation of innegligible impedance mismatching on each module address wiring. In short, branching to the second module address wirings disappears from above the first module address wirings.

The second module address wirings may be connected to their corresponding terminating voltage terminals through resistive elements having their characteristic impedances. Thus, the ends of the second module wirings are matched and terminated. It is therefore possible to restrain the disturbance of each waveform due to signal reflection in the corresponding wiring.

The data terminals may be placed so as to be shifted between at least adjacent terminals as viewed in the direction in which the module data wirings extend. Similarly, the address terminals may be placed so as to be shifted between at least adjacent terminals as viewed in the direction in which the module address wirings extend. It becomes easy to form contacts between the chip data terminals and module data wirings and contacts between the chip address terminals and module address wirings.

[3] If the module data wirings are positively expressed as free of their branching per se, then the module data wirings may be grasped as those having one-stroke writable wiring paths or routes.

If actual signal reflection is taken into consideration, then no undesired signal reflection is developed if the following conditions are met, then no undesired signal reflection is developed for the most part. Namely, the module data wirings have one-stroke writable first wiring paths and second wiring paths which branch off from the first wiring paths and are connected to the module data terminals. The length of each second wiring path is set in such a manner that the time necessary for a signal for ensuring a normal operation to move forward and backward alternately along the second wiring path becomes shorter than a state transition time of the signal.

[4] In a memory module, the following means may be adopted as means for relatively easily implementing the connections between chip connecting terminals and module wirings vertically and horizontally placed in each memory chip in large numbers. Namely, the memory module has a module substrate, and a plurality of memory chips placed along the longitudinal direction of the module substrate and respectively having a plurality of chip connecting terminals. The module substrate has a plurality of module connecting terminals provided in association with the chip connecting terminals included in the plurality memory chips, and module wirings which respectively connect the module connecting terminals and the chip connecting terminals. The module wirings bypass predetermined chip connecting terminals of the plural chip connecting terminals placed in linear form, so as to connect to other predetermined chip connecting terminals.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 26A, 26B and 26C are respectively explanatory views of a dummy memory module available together with the second memory module;

FIG. 44 is a cross-sectional view showing a memory system using the memory modules shown in FIG. 43A and the like with attention to a data signal wiring portion;

FIG. 45 is a cross-sectional view illustrating the memory system using the memory modules shown in FIG. 43A and the like with attention to a power wiring portion; and FIG. 46 is a plan view showing another layout form illustrative of module data wirings for a memory module.

DETAILED DESCRIPTION OF THE INVENTION

Preferred embodiments of the present invention will hereinafter be described in detail with reference to the accompanying drawings.

<<First Memory Module>>

Figure 1:
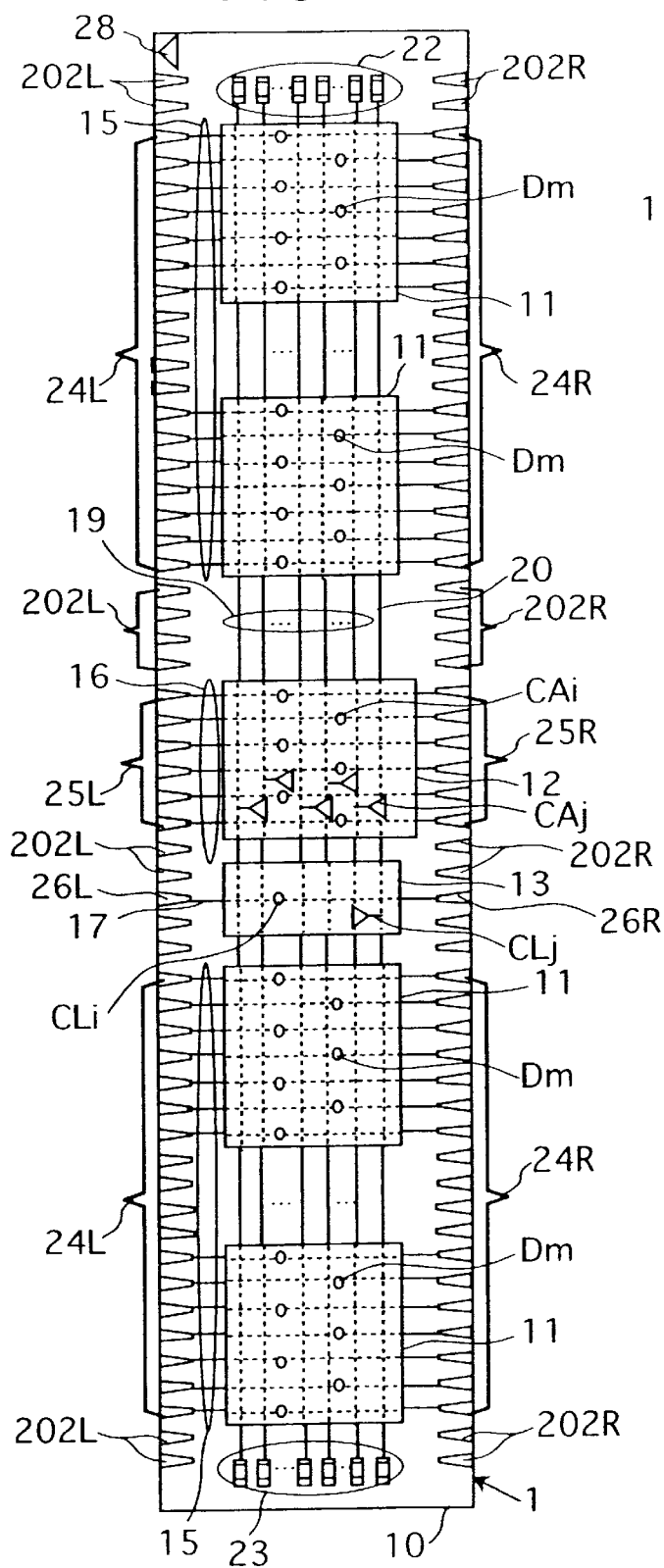
FIG. 1 is a plan view of a first memory module according to the present invention.
Figure 2:
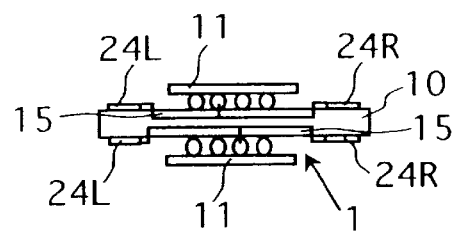
FIG. 2 is a side view of the first memory module according to the present invention.

FIG. 1 is a plan view of a first memory module according to the present invention, and FIG. 2 is a side view thereof, respectively. A memory module 1 shown in FIGS. 1 and 2 includes a plurality of memory chips 11, a command/address buffer chip 12, and a PLL chip 13 which are respectively mounted on the surface and back surface of a substantially rectangular module substrate 10 made up of an epoxy resin or the like.

The memory module 1 has module data wirings 15, module command/address wirings 16, and a module clock wiring 17 extending in the transverse direction of the module substrate 10 as wirings provided therewithin. Further, the memory module 1 includes module command/address distribution wirings 19 and a module clock distribution wiring 20 extending in the longitudinal direction of the module substrate 10. The module command/address distribution wirings 19 and the module clock distribution wiring 20 are provided with terminating resistors 22 and 23. The terminating resistors 22 and 23 terminate the ends of the module command/address distribution wirings 19 and the module clock distribution wiring 20 in terminal power sources and have resistance values each corresponding to the characteristic impedance or effective characteristic of each connected wiring. Those wirings 15, 16, 17, 19 and 20 are equivalently formed on the surface and back surface of the module substrate 10. Incidentally, a mark 28 on the memory module 1 indicates the direction of mounting of the memory module 1 in its corresponding connector when the memory module 1 is mounted in the connector.

The memory module 1 has module data terminal pairs 24R and 24L, a module command/address terminal pair 25R and 25L, and a module clock terminal pair 26R and 26L as module external terminals along the opposite long sides of the module substrate 10. These module external terminals 24R, 24L, 25R, 25L, 26R and 26L are equivalently formed on the surface and back surface of the module substrate 10.

The module data wirings 15 connect each right and left corresponding module data terminal pair 24R and 24L. Memory data terminals Dm of each memory chip 11 are connected to the midpoints of the module data wirings 15. The memory chip 11 is a flip chip (or flip-chip type semiconductor integrated circuit) having bump electrodes for a circuit board or substrate, which are provided in array form, for example. The memory data terminals Dm are provided as solder bump electrodes for each flip chip. In the memory chip 11, such memory data terminals Dm are marked with ○ respectively.

The module command/address wirings 16 connect the right and left corresponding module command/address terminal pair 25R and 25L. Buffer command/address input terminals CAi of the command/address buffer chip 12 are connected to the midpoints of the module command/address wirings 16. For example, the command/address buffer chip 12 is also used as the flip chip, and the buffer command/address input terminals CAi are used as solder bump electrodes. In the command/address buffer chip 12, such buffer command/address input terminals CAi are marked with ○ respectively.

The module clock wiring 17 connects the right and light corresponding module clock terminal pair 26R and 26L. A PLL clock input terminal CLi of the PLL chip 13 is connected to the midpoint of the module clock wiring 17. For example, the PLL chip 13 corresponds to a flip chip, and the PLL clock input terminal CLi is used as a solder bump electrode. In the PLL chip 13, such a PLL clock input terminal CLi is marked with ○.

The module command/address distribution wirings 19 are laid out along the longitudinal direction of the module substrate 10 and has an intermediate portion connected to the buffer command/address output terminals CAj of the command/address buffer chip 12. Similarly, the module clock distribution wiring 20 is laid along the longitudinal direction of the module substrate 10 and has an intermediate portion connected to a PLL clock output terminal CLj. The buffer command/address output terminals CAj and the PLL clock output terminal CLj are represented as symbolic so as to be connected with output terminals of output buffers represented in the form of triangles.

Memory command/address terminals (not shown) for command/address input, of each memory chip 11 are connected to the module command/address distribution wirings 19. Further, a memory clock terminal (not shown) for clock input, of the memory chip 11 and a buffer clock terminal (not shown) for clock input, of the buffer chip 12 are connected to the module clock distribution wiring 20. The memory chip 11 and the buffer chip 12 are capable of performing memory and latch operations in synchronism with a clock signal supplied from the PLL chip 13 through the module clock distribution wiring 20.

Figure 3:
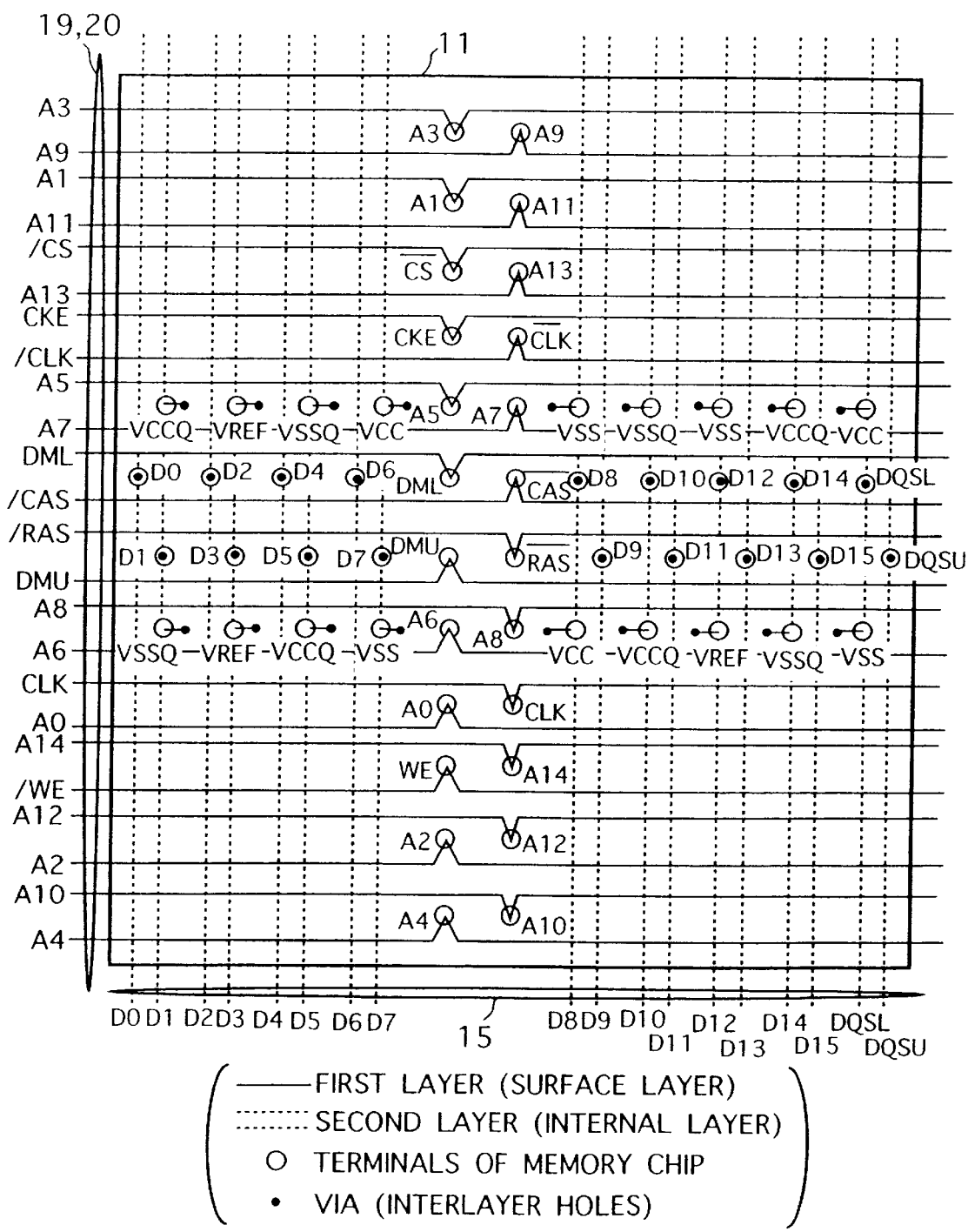
FIG. 3 is an explanatory view showing an example of a wiring arrangement related to a memory chip employed in the memory module shown in FIG. 1.

Incidentally, the memory command/address terminals, memory clock terminal, buffer clock terminal and chip power terminals are not demonstratively shown in FIG. 1. In FIG. 1, module power terminals used for an operating power source are designated at numerals 202L and 202L respectively. FIG. 3 shows an example of a wiring arrangement related to the memory chip employed in the memory module 1. The module substrate 10 has a double-layer wiring structure having a first layer (surface layer) and a second layer (internal layer) respectively corresponding to the surface and back surface thereof. Wirings included in the first layer are indicated by solid lines, whereas wirings included in the second layer are indicated by broken lines. In the drawing, marks ○ indicate external terminals like bump electrodes of each memory chip, and marks 574 indicate via (interlayer trenches or holes) defined in a wiring layer. The memory chip shown in the drawing corresponds to a synchronous DRAM represented as one example. A0 through A13 indicate addresses, D0 through D15 indicate data, and CLK, /CLK indicate two-phase clocks, respectively. CKE indicates a clock enable, DML and DMU indicate data masks, /CS indicates a chip selection, /RAS indicates a row address strobe, /CAS indicates a column address strobe, /WE indicates a write enable, and DQSL and DQSU indicate access control signals or command signals for data strobe. VCCQ, VSSQ, VCC, VSS and VSSQ shown in FIG. 3 indicate power terminals respectively.

The module command/address distribution wirings 19 and the module clock distribution wiring 20 are laid or arranged in the form orthogonal to the module data wirings 15 on the module substrate 10. As is apparent from FIG. 3, the signal wirings 19 and 20 are connected to their corresponding terminals of each memory chip 11 through one-stroke writable wiring paths. It is apparent that according to the one-stroke writable wiring paths, the module command/address distribution wirings 19 and the module clock distribution wiring 20 per se have no branches.

Judging from the standpoint of control on undesired signal reflection, the one-stroke writable paths are most suitable but all the wiring branches are not denied. If the following conditions are met, then no undesired signal reflection is developed for the most part. Namely, the module data wirings 15 for D0, D1, etc. are formed in a wiring layer corresponding to the second layer of the module substrate 10. When the module data wirings 15 are connected to their corresponding memory data terminals D of each memory chip 11 through the via (interlayer holes), the via portions slightly form branch portions respectively. Thus, the module data wirings 15 serve as one-stroke writable first wiring paths, whereas the via portions branched off from the first wiring paths so as to be connected to the memory data terminals Dm constitute second wiring paths. At this time, the length of the second wiring path may be set so that the time necessary for a signal to assure a normal operation, for example to go to and from the second wiring path becomes shorter than a state transition time of the signal. In short, each branch portion whose signal path is as short as negligible at a signal reflection point, may substantially be regarded as part of the one-stroke wiring path.

When the memory data terminals are placed so as to be shifted between at least adjacent terminals as viewed in the direction in which the module data wirings extend, as in the case of D0, D1, . . . in FIG. 3, it becomes easy to form contacts between the memory data terminals Dm and the module data wirings 15.

Figure 4:
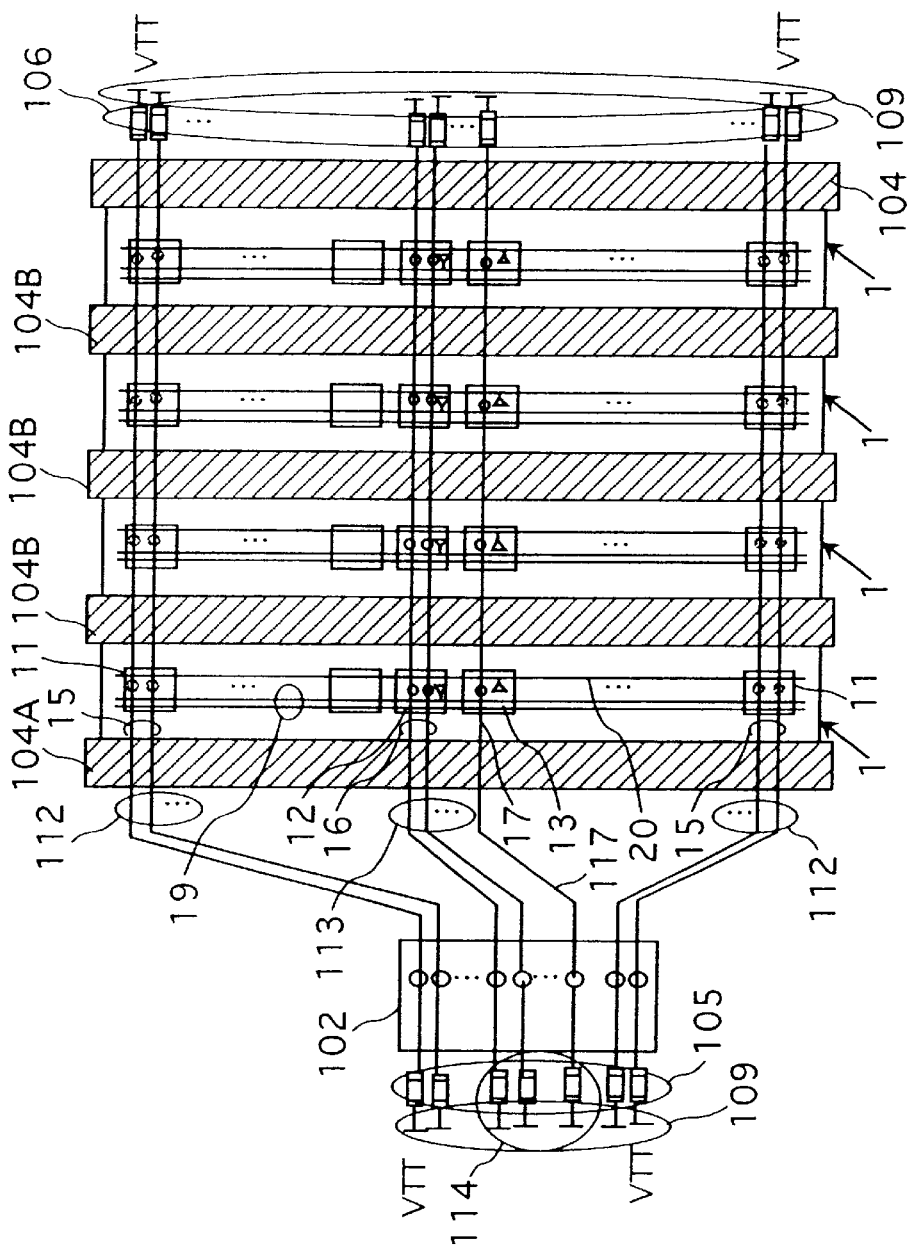
FIG. 4 is a plan view of a memory system having the memory modules shown in FIG. 1.
Figure 5:
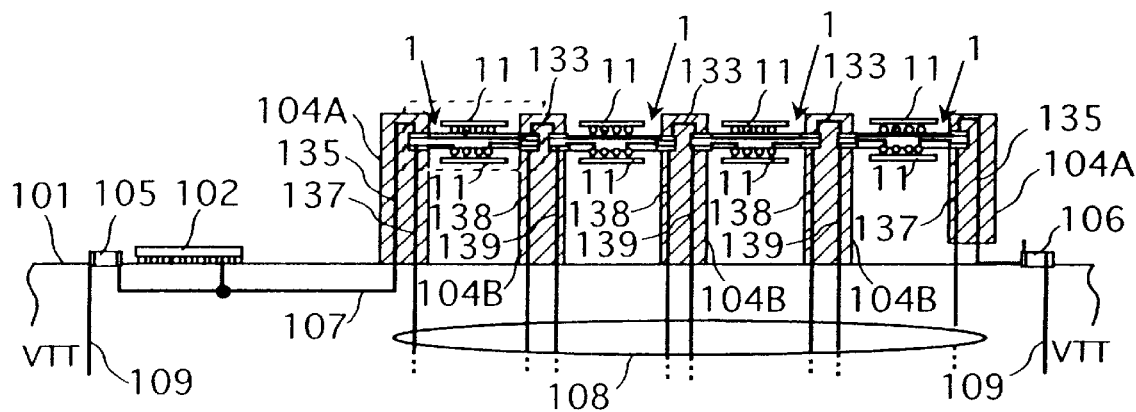
FIG. 5 is a front view of the memory system having the memory modules shown in FIG. 1.

FIG. 4 is a plan view of a memory system having the memory modules 1 according to the present invention, and FIG. 5 is a front view of the memory system, respectively.

Although not restricted in particular, the memory system shown in the same drawing includes a memory controller 102, connectors 104A and 104B, terminating resistors 105 and 106, signal wirings 107, power wirings 108, and terminal voltage power wirings 109 provided on a motherboard 101. The memory system is configured in such a manner that, for example, the memory modules 1 are fitted in their corresponding connectors 104A and 104B.

The signal wirings 107 comprise data signal wirings 112, address/command signal wirings 113 and a clock signal wiring 117 illustrated in FIG. 4 by way of example. Memory address/command input terminals of memory chips 11 placed on the same surface of one memory module 1 as described above, and address/command signal output terminals of an address/command buffer chip 12 are respectively connected to one another by module address/command distribution wirings 19. The memory chip 11 on the memory module 1 receives address/command signals from the address/command buffer chip 12 through the module address/command distribution wirings 19. Further, clock input terminals of the memory chips 11 placed on the same surface of one memory module 1, a clock input terminal of the address/command buffer chip 12, and a clock output terminal of a PLL chip 13 are respectively connected to one another by a clock distribution wiring 20. Each memory chip 11 and the address/command buffer chip 12 receive a clock signal from the PLL chip 13 through the clock distribution wiring 20.

As shown in FIG. 4 by way of example, a plurality of memory modules 1 are placed on the motherboard 101 in parallel and connected to one another in series by the right and left connectors 104. As illustrated in FIG. 5 by way of example, the connectors 104A and 104B respectively include the power wirings 108 for supplying power from the motherboard 101 to the memory modules 1, and the signal wirings 107 (112, 113 and 117) for connecting between signal terminals of the adjacent memory modules. The signal wirings 107 on the motherboard pass under the memory controller 102 and pass within the plural memory modules 1 through the connectors 104. Further, the signal wirings 107 are terminated into a predetermined voltage VTT at the terminal voltage power wirings 109 through the terminating resistors 105 and 106 at both ends thereof or at at least one-sided end thereof.

As shown in FIG. 5, signal terminals of the memory controller 102 are connected to their corresponding signal wirings 107 which pass under the memory controller 102 under the control of the memory controller 2. As shown in FIG. 4, data terminals of each memory chip 11 on the memory module 1 are connected to their corresponding data signal wirings 112 which pass through the memory module 1. Incidentally, terminating resistors 114 on the memory controller 102 side may not be provided for the address/command signal wirings 113 and the clock signal wiring 117. Address/command input terminals of the address/command buffer chip 12 on the memory module 1 are respectively connected to the address/command signal wirings 113 which pass through the memory module 1. Assuming now that the number of data terminals of each memory chip 11 is defined as n and the number of the memory chips 11 placed on the one side of the memory module 1 is defined as m, the memory system shown in FIG. 4 has m×n data signal wirings 112. The m memory chips 11 placed on the one side of one memory module of plural memory modules are selected for one access according to a chip select signal of command signals generated by the memory controller 102.

Figure 6:
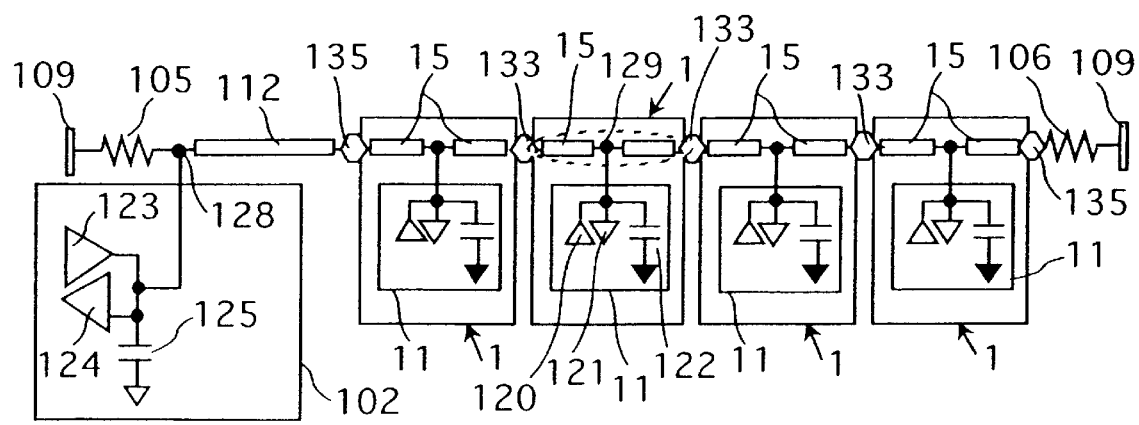
FIG. 6 is a schematic equivalent circuit diagram of the memory system shown in FIG. 4.

FIG. 6 is a schematic equivalent circuit diagram of the memory system shown in FIGS. 4 and 5 and particularly shows one data signal wiring system. When the data signal wiring system is viewed on a circuit basis, terminal power sources 109, terminating resistors 105 and 106, a data signal wiring 112 for a motherboard, connectors 104A and 104B, and module data wirings 15 of memory modules 1 are principally connected in series. Here, since the whole length of the data signal wiring 112 on the motherboard 101 and the module data wirings 15 of the memory modules reaches several tens of millimeters, they are handled as a transmission line on a circuit basis. A memory controller I/O terminal 128 of a memory controller 2 is provided at one-sided end on the terminating resistor 105 side, of the data signal wiring 112 on the motherboard 101. Each of the output capacity of an output circuit 123 of the memory controller 102 and the input capacity of an input circuit 124 of the memory controller 102, etc. is in view as memory controller I/O load capacity 125. Similarly, a data terminal (I/O terminal) 129 of each memory chip 11 is located midway between the data signal wirings 15 of each memory module 1. Each of the output capacity of an output circuit 120 of each memory chip 11 and the input capacity of an input circuit 121 thereof, etc. is in view as memory I/O load capacity 122. In the memory controller output circuit 123 and the output circuit 120 of each memory chip 11, a push-pull type, an open drain type, etc. are considered as their circuit types or modes. In the present embodiment, no request is made in particular. Although not illustrated in particular, a mechanism for controlling a through rate and a mechanism for controlling output impedance, for example may be provided. Both sides of the data signal wiring system are terminated with the terminating resistors for the purpose of preventing reflection with respect to both of a signal transmitted from the memory controller output circuit 123 to the input circuit 121 of each memory chip 11 and a signal transmitted from the output circuit 120 of each memory chip 11 to the memory controller input circuit 124. Thus, terminating resistors may be placed only at a far end with respect to a signal transmission path extending in only one direction as in the case of an address output and a command output of the memory controller 102. As described above, the terminating resistors 114 shown in FIG. 4 may be omitted.

Figure 7:
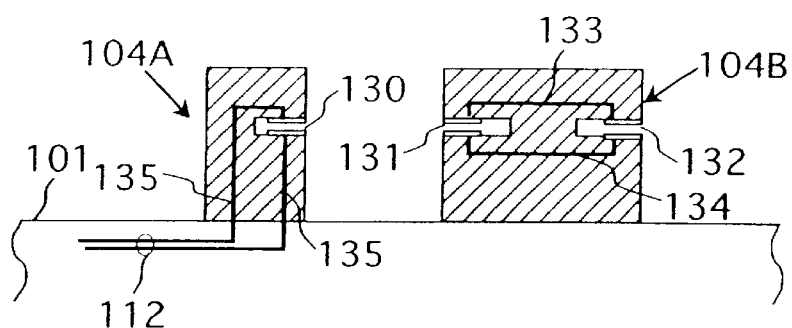
FIG. 7 is a schematic vertical cross-sectional view of data wiring portions of connectors applicable to the memory module shown in FIG. 1.

FIG. 7 is a vertical cross-sectional view schematically showing data wiring portions of connectors 104A and 104B. The connector 104A has a single horizontal trench or groove defined in one side thereof. Connector terminal sequences or rows 130 are formed on upper and lower surfaces of an internal surface of the horizontal groove. The connector terminal sequences 130 are connected to their corresponding wirings of data signal wirings 112 through in-connector wirings 135 every connector terminals. The connector 104B has single horizontal grooves defined in both sides thereof. Connector terminal sequences 131 and 132 are respectively formed on upper and lower surfaces of internal surfaces of the horizontal grooves. Terminals of the connector terminal sequences 131 and terminals of the connector terminal sequences 132, i.e., their corresponding terminals are connected in series to one another by in-connector wirings 133 and 134.

Figure 8:
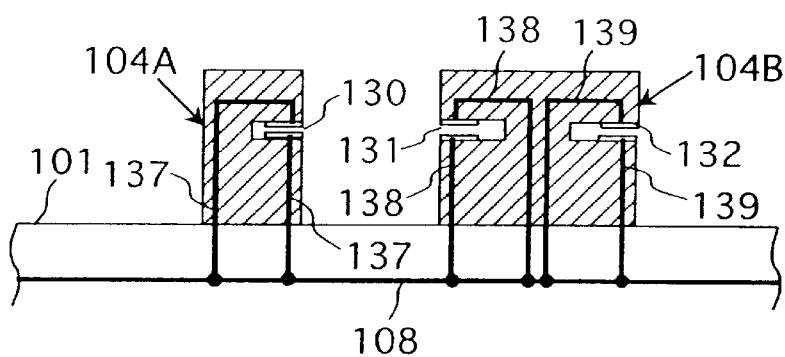
FIG. 8 is a schematic vertical cross-sectional view of power wiring portions of the connectors applicable to the memory module shown in FIG. 1.

FIG. 8 is a vertical cross-sectional view schematically showing power wiring portions of connectors 104A and 104B. A motherboard 101 is provided with a power wiring 108. Power connector terminals included in connector terminal sequences 130 are connected to their corresponding power wiring 108 through in-connector wirings 137, power connector terminals included in connector terminal sequences 131 are connected to their corresponding power wiring 108 through in-connector wirings 138, and power connector terminals included in connector terminal sequences 132 are connected to their corresponding power wiring 108 through in-connector wirings 139. Even in the case of a power source, the connections shown in FIG. 7 may be adopted. However, the adoption of the connection form shown in FIG. 8 rather than one shown in FIG. 7 allows stabilization of the supply of power to each memory chip 11 or the like. The command/address wirings 113 may also be connected to the connector terminal sequences 130, 131 and 132 of the connectors 104A and 104B in the same manner as the power wiring 108.

Figure 9:
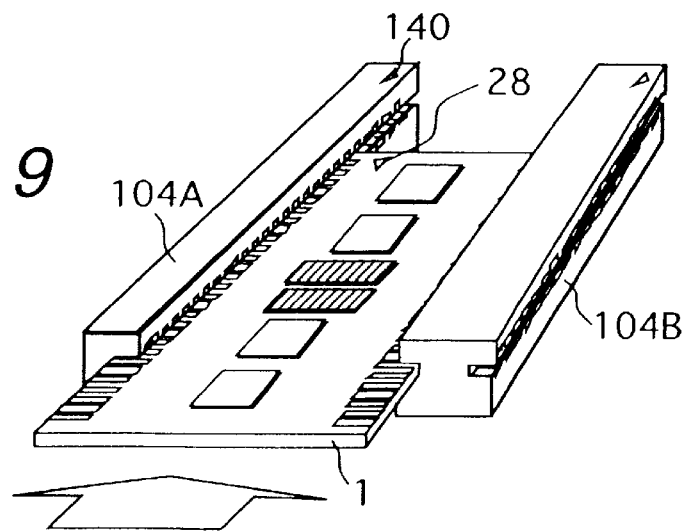
FIG. 9 is a perspective view showing the manner in which the memory module is mounted in the connectors applicable to the memory module shown in FIG. 1.

FIG. 9 is a perspective view showing the mounting of the memory module 1 in connectors 104A and 104B. In order to fit the memory module 1 in the connectors 104A and 104B, terminal sequences of the memory module 1 are respectively put so as to be inserted between terminal sequences 130 of the connector 104A and between terminal sequences 131 of the connector 104B as shown in FIG. 9. At this time, marks 140 placed on the connectors are those used to indicate or point out the orientation and direction of the surface of the memory module 1. The surface and direction of the memory module 1 are aligned with each other in such a manner that a fit-in direction indication mark 28 for the memory module 1 and the mark 140 of each connector move closest to each other.

Figure 10:
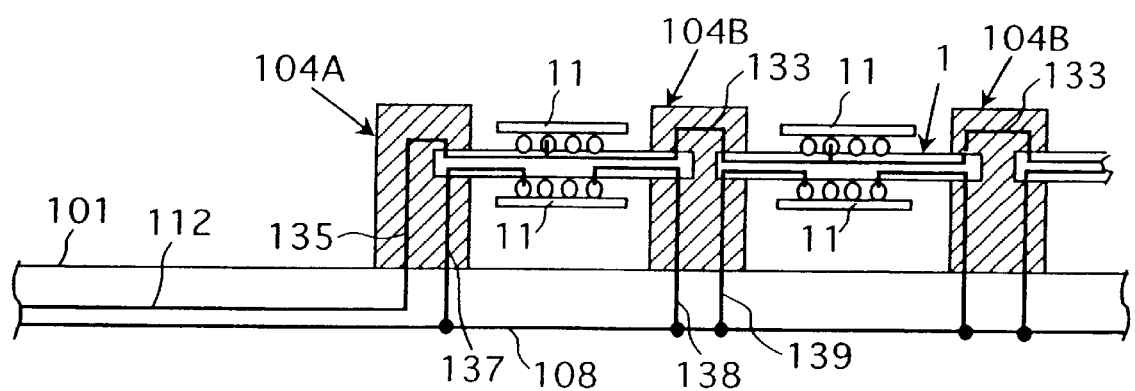
FIG. 10 is a cross-sectional view showing a state in which the memory modules have been fitted in the connectors each applicable to the memory module shown in FIG. 1.

FIG. 10 is a cross-sectional view showing the manner in which the memory modules 1 have been mounted in their corresponding connectors 104A and 104B. In FIG. 10, for convenience, paths connected to their corresponding memory chips located on the upper sides of the memory modules 1 are used as signal paths, and paths connected to their corresponding memory chips located on the lower sides of the memory modules 1 are used as power paths. Data signal paths are defined as wiring paths which pass without branching off at the connectors 104A and 104B and the memory modules 1. Since the power wirings of the respective memory modules 1 are also respectively connected to a power wiring 108 of a motherboard 101 through the mounted connectors 104A and 104B, the supply of sufficient power can be implemented and a voltage drop of a power source can be prevented from occurring.

Figure 11:
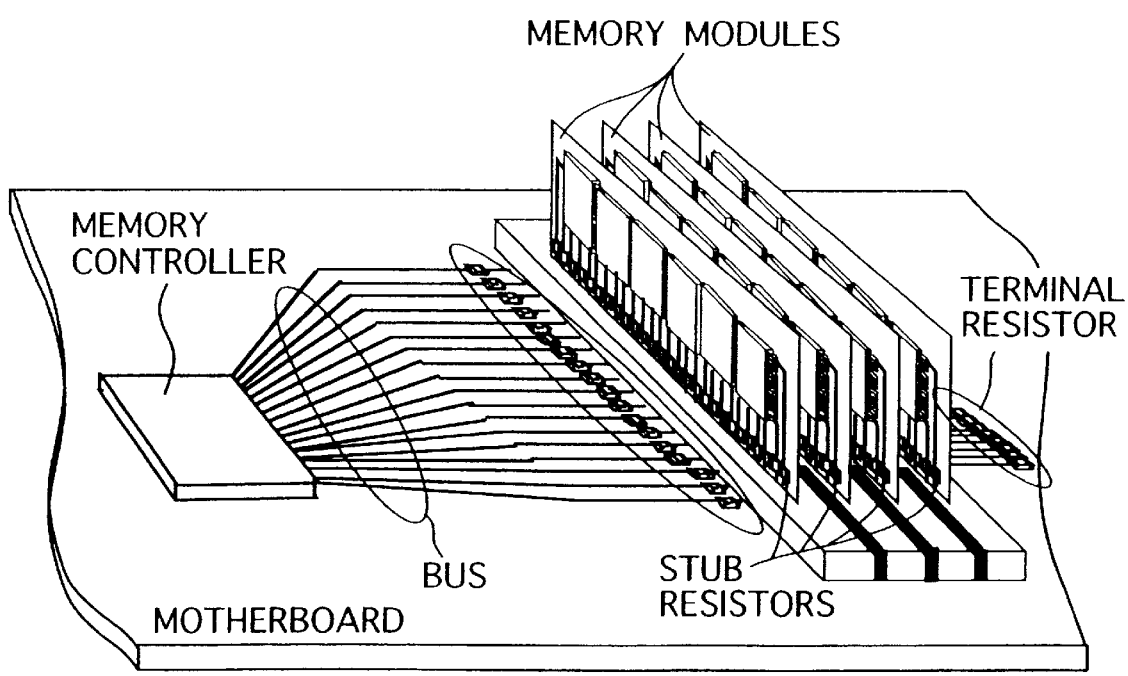
FIG. 11 is a perspective view of a memory system related to a comparative example having an SSTL interface.
Figure 12:
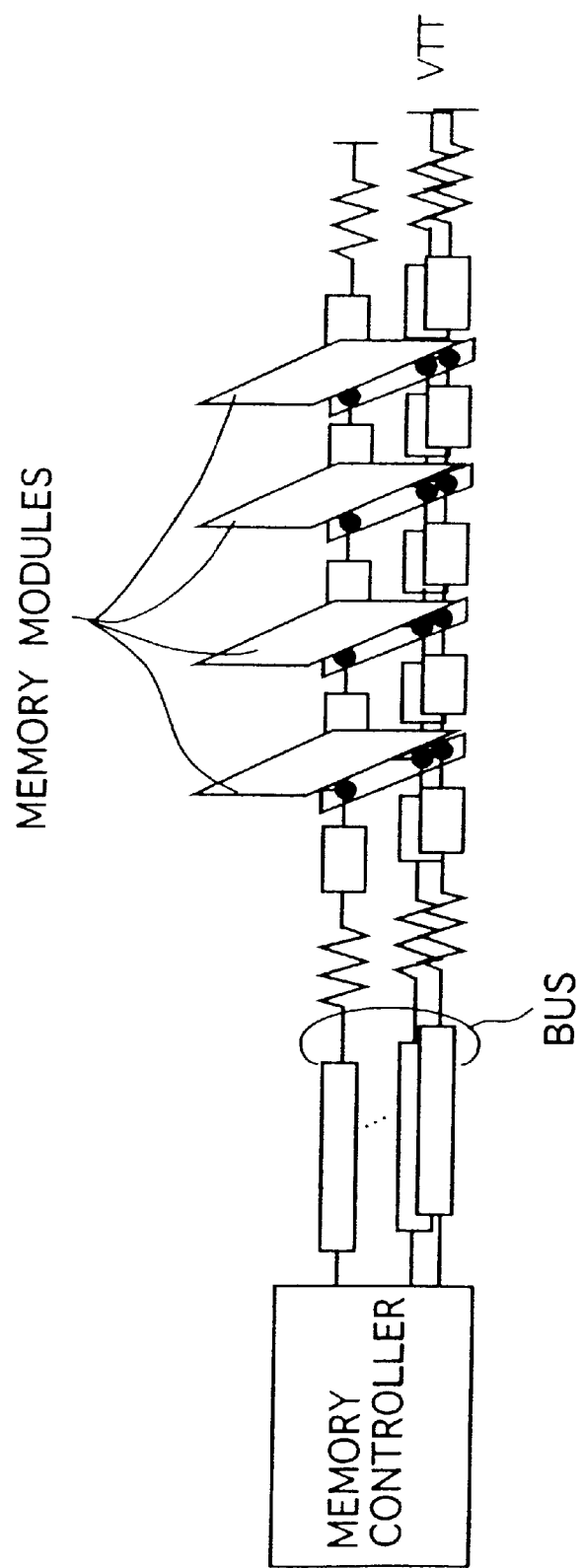
FIG. 12 is an equivalent circuit diagram of the memory system related to the comparative example shown in FIG. 11.

According to the memory module, the following action and effects can be obtained. According to the memory module 1, the module data wirings 15 on the memory module 1 constitute a memory access data bus together with the data signal wirings 112 on the motherboard 101 as is apparent from FIG. 4. Thus, in the memory system in which a plurality of memory modules 1 are connected in series, the module data wirings 15 of the respective memory modules 1 are connected in sequential form. Further, each individual module data wirings 15 do not constitute branch wirings with respect to the data signal wirings 112 on the motherboard 101 of the memory system. Accordingly, such signal reflection as caused by branching with respect to the data signal wirings 112 on the motherboard 101 of the memory system does not occur. Since memory modules are branch-connected to a bus on a motherboard in the case of a memory system related to a comparative example having an SSTL interface, which is shown in FIGS. 11 and 12, for example, stub resistors are placed every branches to cope with undesired signal reflection. Therefore, in the comparative example, delay components of the bus itself on the motherboard increase, thus interfering with a high-speed operation. In the memory system using the memory modules 1 each shown in FIG. 1, an undesired load on each signal wiring on the motherboard does not increase, and the configuration for inhibiting or blocking the signal reflection does not interfere with a high-speed operation.

Further, since the data terminals Dm of each memory chip 11 are directly connected to the module data wirings 15 on each memory module 1, such signal reflection as caused by branching to the module data wirings 15 is also developed.

Figure 13:
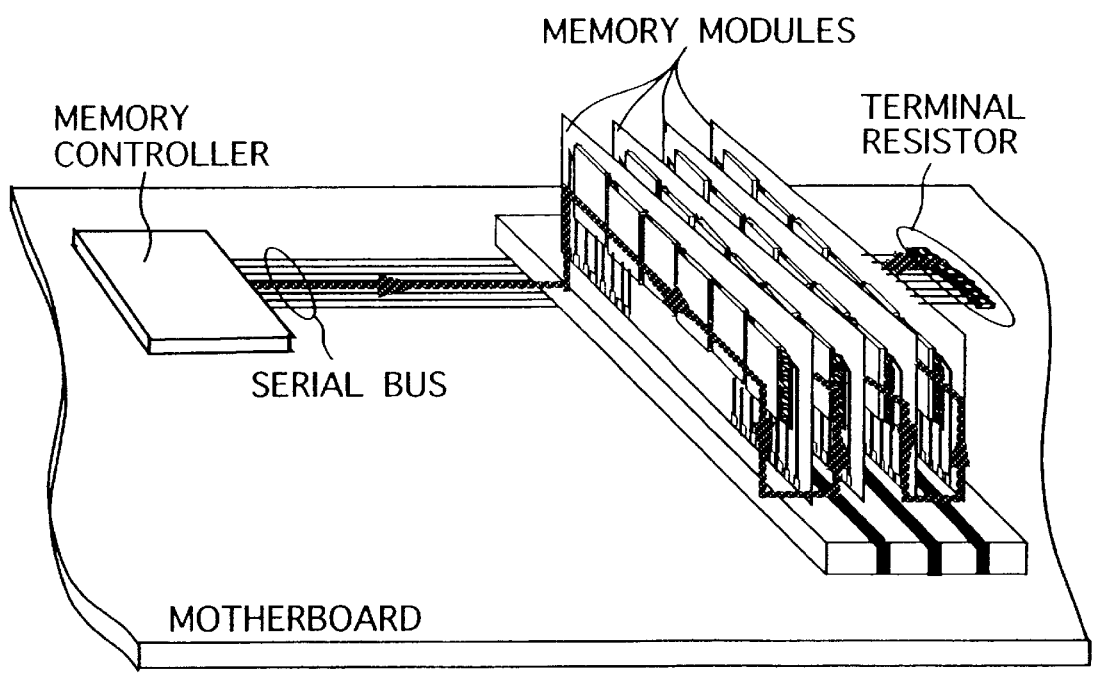
FIG. 13 is a perspective view of a memory system related to a comparative example in which memory modules having memory chips connected in serial form are connected in series.
Figure 14:
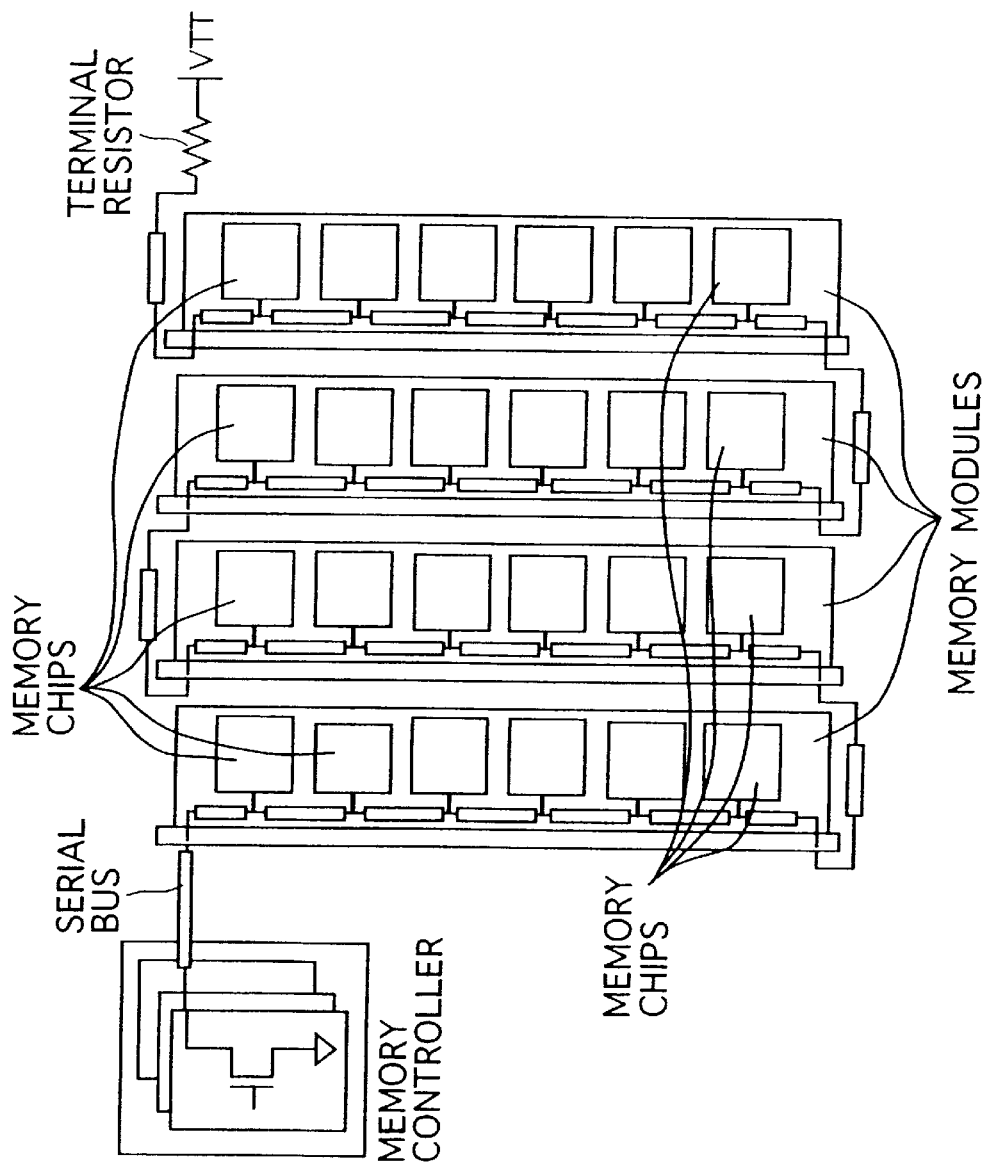
FIG. 14 is an equivalent circuit diagram of the memory system related to the comparative example shown in FIG. 13.

In the memory module 1, parallel access for the number of bits corresponding to the width of the memory access data bus is assured. Thus, the disturbance of each signal waveform due to the signal reflection is restrained while an increase in access time is being controlled, thereby to allow an increase in reliability of signal transmission. In a comparative example shown in FIGS. 13 and 14, a plurality of memory chips share the use of an in-module data bus on each memory module. The memory modules are connected in series with a serial bus. Further, since the memory modules are not branch-connected to the serial bus, signal reflection caused by branching is not substantially developed. However, limitations are imposed on high-speed access because the bus is made long and a wiring load increases.

As forms of the module data terminal pair 24L and 24R and the module data wirings 15, the module data terminal pairs 24L and 24R are respectively placed at one long-side portions and the other long-side portions of each individual memory chip-mounted surfaces of the module substrate 10 when the plurality of memory chips 11 are arranged along the longitudinal direction of the module substrate 10. In other words, the module data wirings 15 are caused to extend from one long-side portion of each memory chip-mounted surface of the module substrate 10 to the other long-side portion thereof. Thus, the length of each module data wiring 15 becomes consequentially short and the parasitic capacitance of each wiring and the wiring resistance thereof are reduced.

Since the module data wirings 15 are linearly laid in the transverse direction of the module substrate 10, and the module command/address wirings 16 and 20 are laid in the shape of a substantially cross, they are most suitable for the shortening of wiring lengths of the module command/address wirings together with the module data wirings.

Since the module command/address wirings 16 for coupling the module address terminal pair 25R and 25L to each other are separated from the command/address distribution wirings 19 through the command/address buffer chip 12, the formation of in-negligible impedance mismatching points on the module command/address wirings 16 can also be blocked.

Owing to the termination of the module command/address distribution wirings 19 with the resistive elements 22 and 23 having their characteristic impedances, the ends of the module command/address wirings 19 are matched and terminated. Thus, the disturbance of each waveform due to signal reflection can be reduced to a minimum at the wirings 19.

Results of simulation of data signal waveforms employed in the memory system using the memory modules 1 will now be explained.

Figure 15:
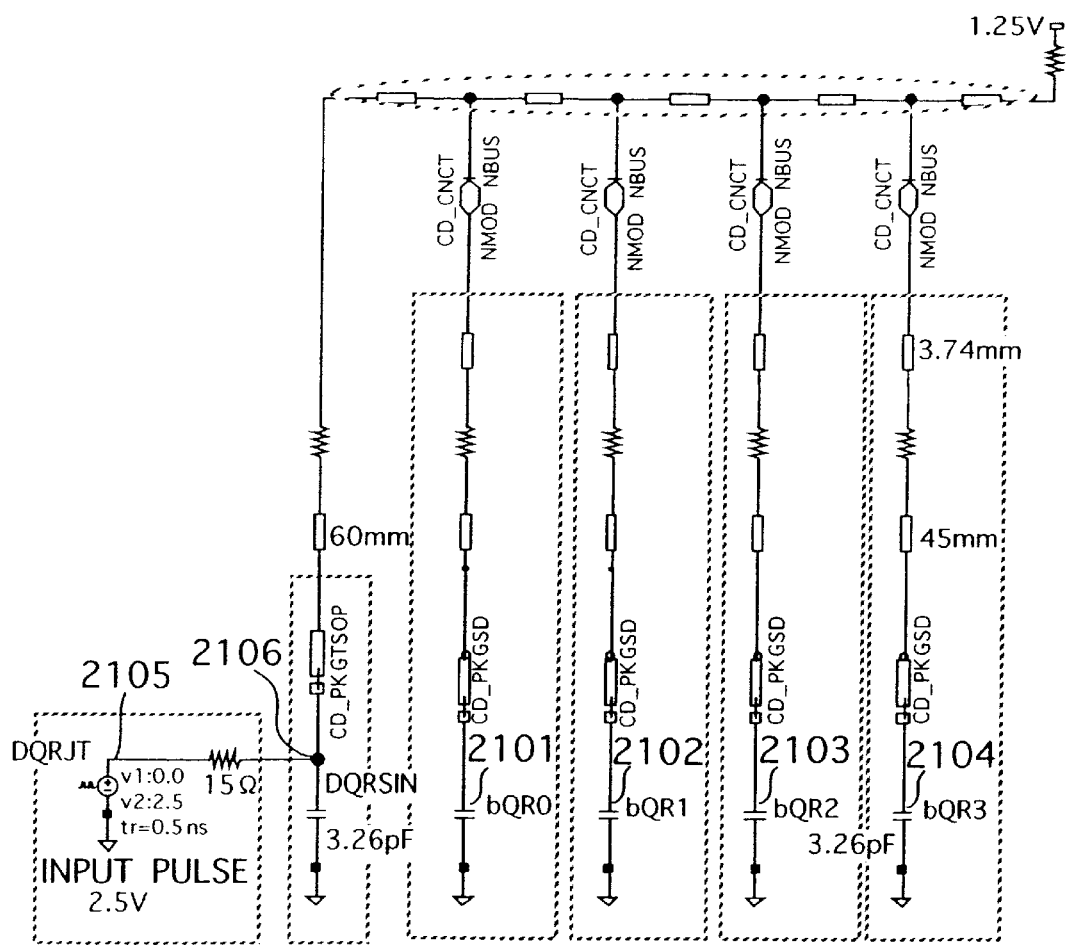
FIG. 15 is a simulation circuit diagram of SSTL employed in the memory system configured in the form of FIG. 11.
Figure 16A:
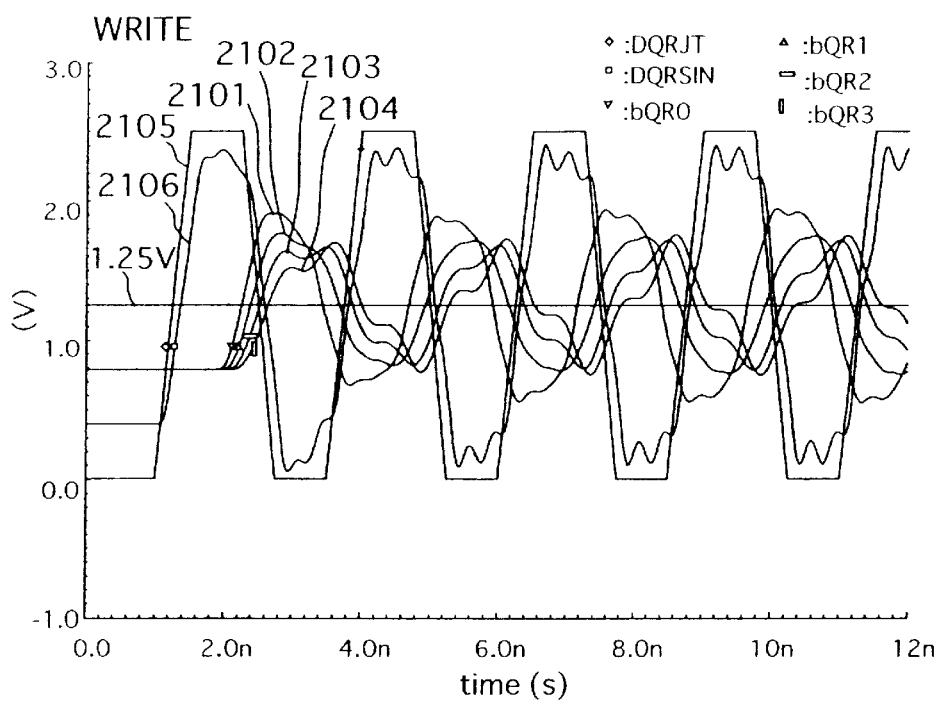
FIGS. 16A and 16B are respectively explanatory views showing simulation results of SSTL signal waveforms at write and read operations of the simulation circuit shown in FIG. 15.
Figure 16B:
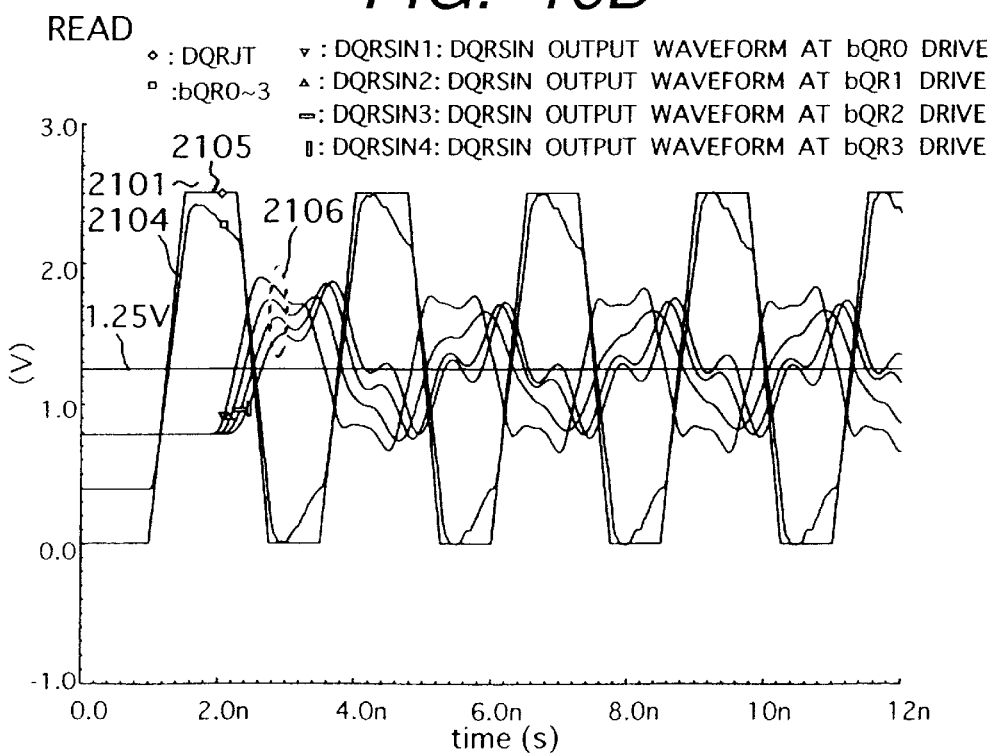

As a comparative example, a simulation circuit of SSTL employed in the memory system of the type shown in FIG. 11 is first shown in FIG. 15. FIG. 16A shows the result of simulation of SSTL signal waveforms at a write operation of the simulation circuit shown in FIG. 15. FIG. 16B shows the result of simulation of SSTL signal waveforms at a read operation of the simulation circuit shown in FIG. 15. There may be cases in which a signal waveform at a receiving end is disturbed upon a high-speed operation or when each branch wiring is long, in the case of the SSTL of such a circuit type as shown in FIG. 11.

Figure 17:
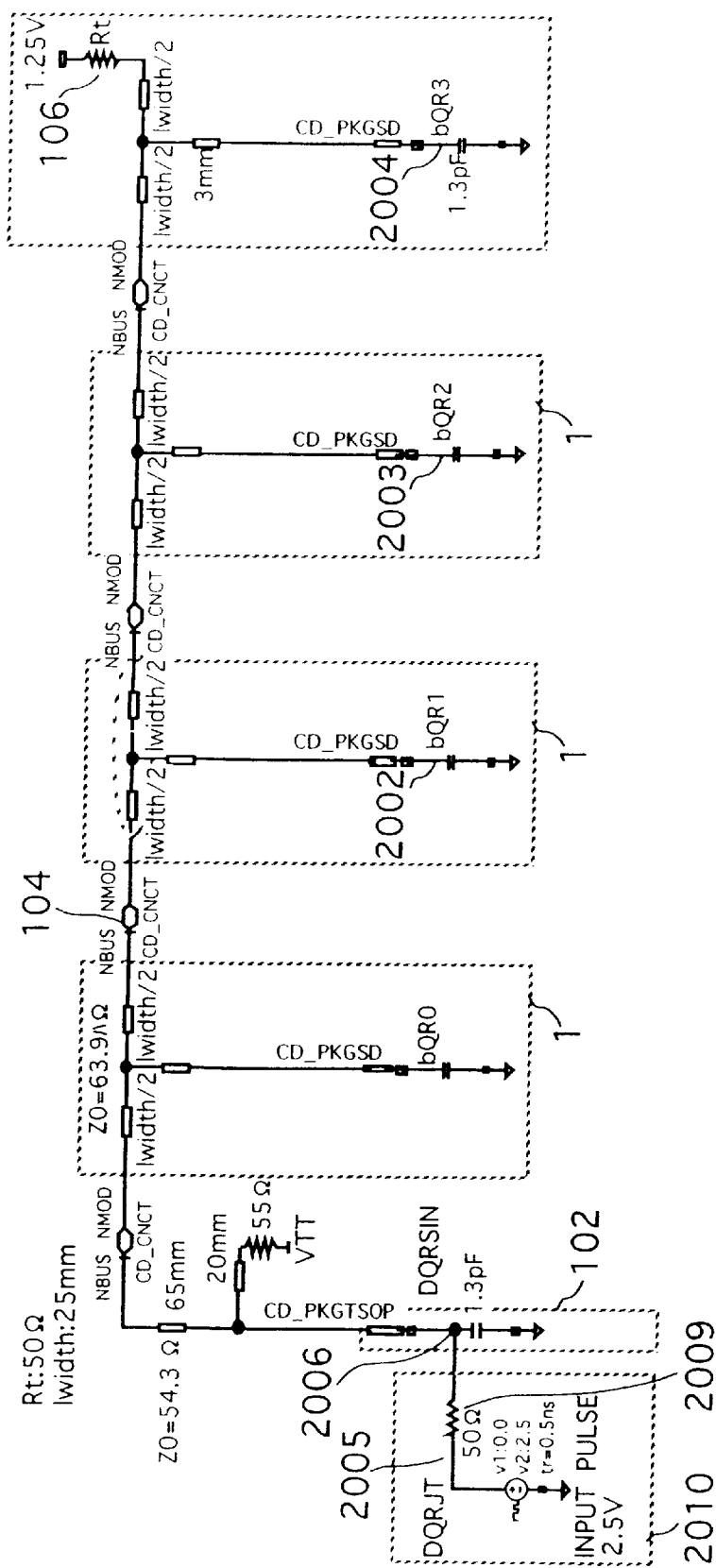
FIG. 17 is a simulation circuit diagram related to data signals employed in the memory system described in FIG. 4.

FIG. 17 illustrates a simulation circuit related to data signals employed in the memory system described in FIG. 4 as an example. Let's now assume that a driver 2010 is placed under a memory controller 102 upon write operation simulation, and placed under each memory module upon read operation simulation. A push-pull output circuit having an output resistor 2009 is assumed as the driver 2010. In the present example, the resistance value of the output resistor is set as 50 Ω. Further, a terminating resistor Rt is set to a value substantially identical to the effective characteristic impedance of each data signal wiring. A terminating resistor on the memory controller side, which is equal to 55 Ω in resistance value, is set to a value substantially equal to the characteristic impedance of a transmission line laid between the memory controller and a memory module located at an end close to the memory controller.

Figure 18A:
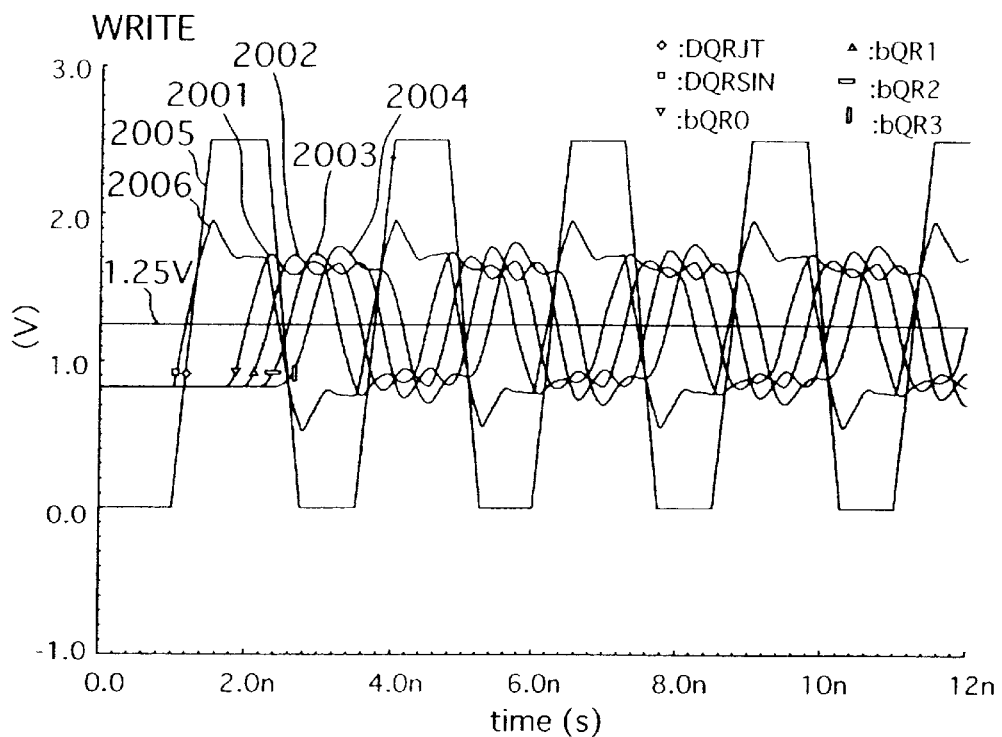
FIGS. 18A and 18B are respectively explanatory views illustrating simulation results at write and read operations of the simulation circuit shown in FIG. 17.
Figure 18B:
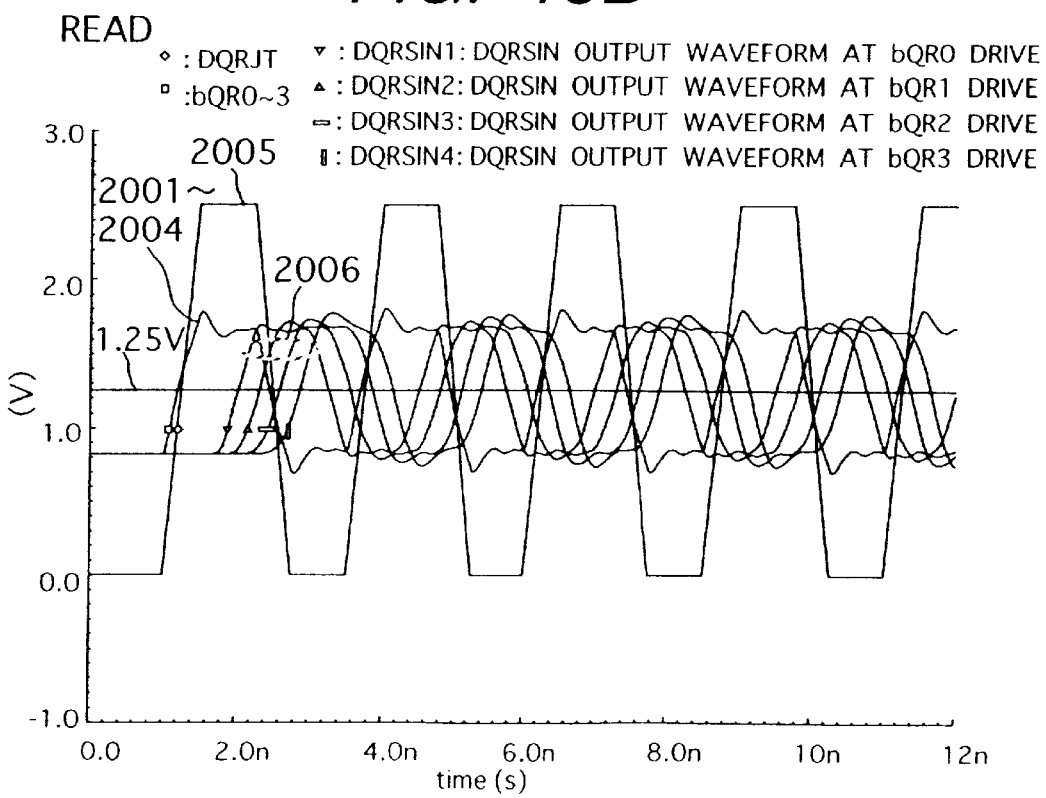

FIG. 18A shows a simulation result at the write operation of the simulation circuit (memory system described in FIG. 4) shown in FIG. 17. It is understood that when data signals bQR0 through bQR3 (2001 through 2004) inputted to each individual memory chips are viewed, they are small in waveform disturbance as compared with data signals bQR0 through bQR3 (2101 through 2104) inputted to the memory chips at the write operation-based simulation result shown in FIG. 16A. FIG. 18B shows a simulation result at the read operation of the simulation circuit (memory system described in FIG. 4) shown in FIG. 17. DQRSIN1 through DQRSIN4 in the drawing respectively indicate data signals DQRSIN1 through DQRSIN4 (2006) respectively inputted to the memory controller when the data signals bQR0 through bQR3 (2001 through 2004) inputted to the memory chips are outputted. It is understood that they are small in waveform disturbance as compared with data signals DQRSIN1 through DQRSIN4 (2106) inputted to their corresponding memory chips at the read operation-based simulation result of the memory system according to the comparative example shown in FIG. 16B. Even in the case of a system in which an output resistor is set to 15 Ω, a satisfactory waveform is obtained in the same manner as described above. In this case, an effect is brought about in that power consumption increases but logical amplitude can be made great.

<<Second Memory Module>>

Figure 19A:
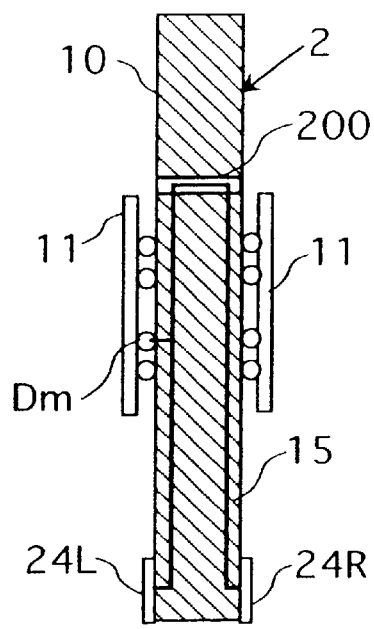
FIGS. 19A, 19B and 19C are respectively cross-sectional views related to a second memory module according to the present invention.
Figure 19B:
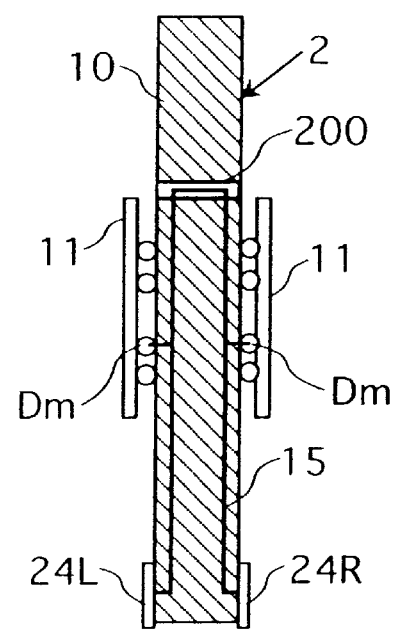
Figure 19C:
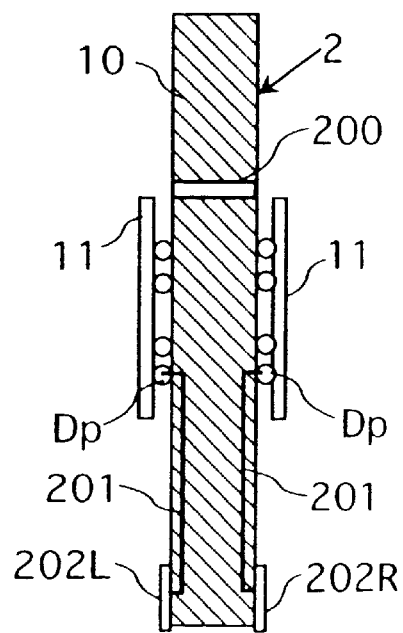

FIGS. 19A, 19B and 19C respectively show cross sections of a second memory module according to the present invention. FIG. 19A is a cross-sectional view related to a data signal wiring employed in a one-bank type memory module. In the present memory module 2, a module data terminal pair 24L and 24R is placed on both surfaces of a module substrate 10 along one long-side portion thereof. A module data wiring 15 is connected to the module data terminal pair 24R and 24L via a through hole 200. The module data wiring 15 has a one-stroke writable wiring route or path in a manner similar to the first memory module 1. Such branches as formed by the via (interlayer holes), which are as small as negligible, are developed between the module data wiring 15 and the memory data terminals Dm of each memory chip 11. Such branch portions do not lead to undesired signal reflection as is apparent from the above.

FIG. 19B is a cross-sectional view related to a signal wiring at a two-bank type memory module. In the memory module 2 shown in FIG. 19A, one module data wiring 15 is connected to its corresponding memory data terminal Dm of one memory chip placed on one side of the module substrate 10, whereas in the memory module shown in FIG. 19B, one module data wiring 15 is connected to memory data terminals Dm and Dm of memory chips 11 and 11 placed on both surfaces of a module substrate 10 on a one-stroke writing basis.

FIG. 19C is a cross-sectional view related to a power wiring for the memory module 2. Module power wirings 201 are wired to their corresponding chip power terminals Dp but have no need for connection under a one-stroke writable route or path. They extend so as to branch off from module power terminals 202L and 202R respectively. Incidentally, module command/address wirings 16 and a module clock wiring 17 may be handled in a manner similar to the module power wirings 201. Alternatively, they may be handled in a manner similar to the module data wirings 15 as shown in FIG. 1.

Figure 20A:
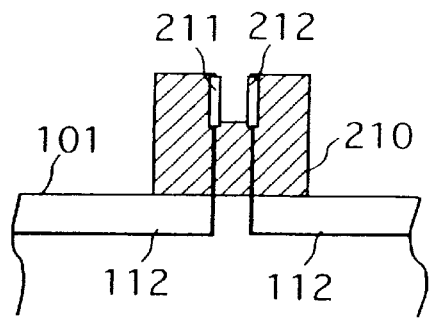
FIGS. 20A and 20B are respectively explanatory views of a connector applicable to the second memory module.

FIG. 20A shows a connector 210 for the second memory module 2 with attention to each signal wiring. The connector 210 has a single vertical trench or groove. Connector terminal sequences are formed on the right and left internal surfaces of the vertical groove as viewed in the front/back direction of the sheet. Connector terminals 212 and 212 are typically shown in the drawing. Data signal wirings 112 on a motherboard are respectively connected to the connector terminals 211 and 211, where they are divided.

Figure 20B:
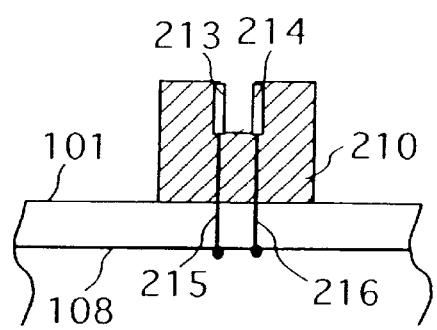

FIG. 20B shows the connector 210 for the second memory module 2 with attention to a power wiring. Connector terminals 213 and 214 typically shown as connector terminals for power are respectively connected to branch wirings 215 and 216 which branch off from the power wiring 108. The power wiring 108 is not electrically divided in the course thereof.

Figure 21A:
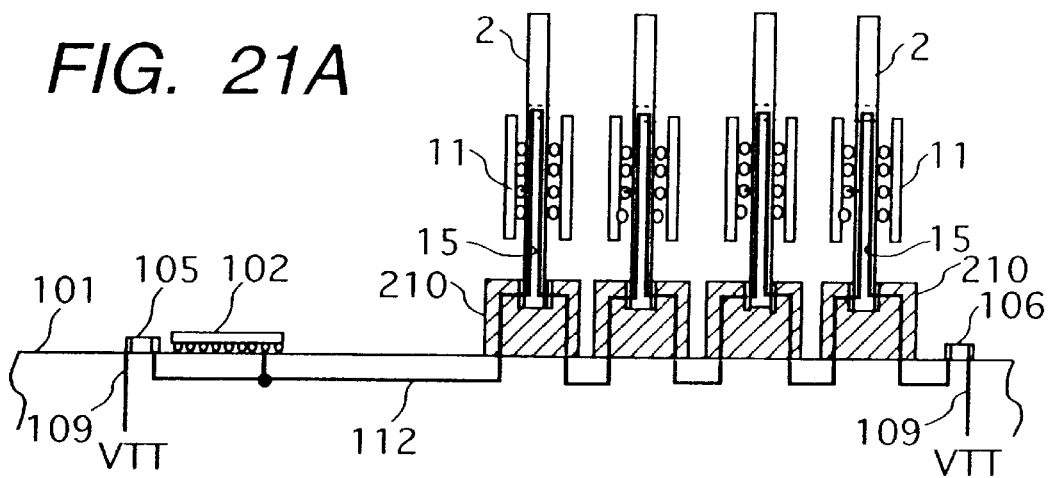
FIGS. 21A and 21B are respectively cross-sectional views showing a memory system equipped with the second memory modules.

A cross section of a memory system equipped with memory modules 2 is shown in FIG. 21A in relation to a signal wiring. When the memory modules 2 are mounted in their corresponding connectors 210 in the memory system shown in the same drawing, data signal wirings 112 divided by the connectors 210 are connected to one another through module data wirings 15 of the memory modules 2.

Figure 21B:
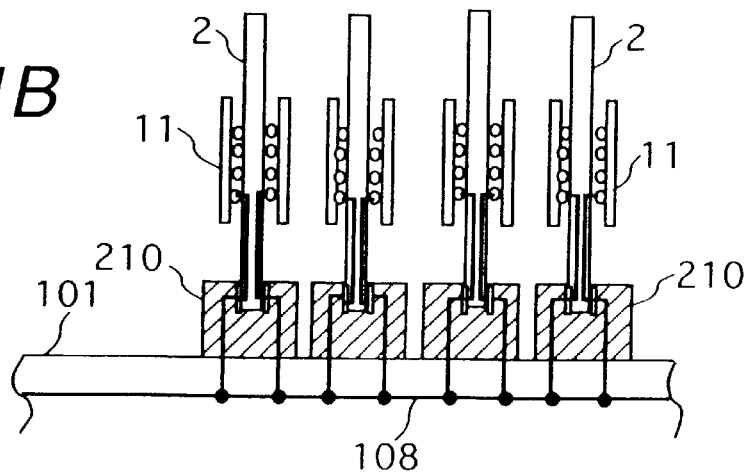

A cross section of the memory system equipped with the memory modules 2 is shown in FIG. 21B in association with a power wiring. When the memory modules 2 are fitted in their corresponding connectors 210 in the present memory system, module power terminals of the memory modules 2 are respectively connected to a power wiring 108 of a motherboard 101 through power connector terminals 213 and 214 of the connectors 210. Incidentally, the command/ address signal wirings 113 may be connected to each memory module 2 through the connector 210 from the command/address signal wirings 113 of the motherboard 101 in the same manner as the power wiring 108 in FIG. 20A. Of course, they may be connected as shown in FIG. 21B.

Even in the case of the second memory module 2 in the same manner as described above, branching which leads to undesired signal reflection, is not developed. Each memory chip can electrically be connected to the data signal wirings of the motherboard 101 without an increase in wiring length.

<<Third Memory Module>>

Figure 22:
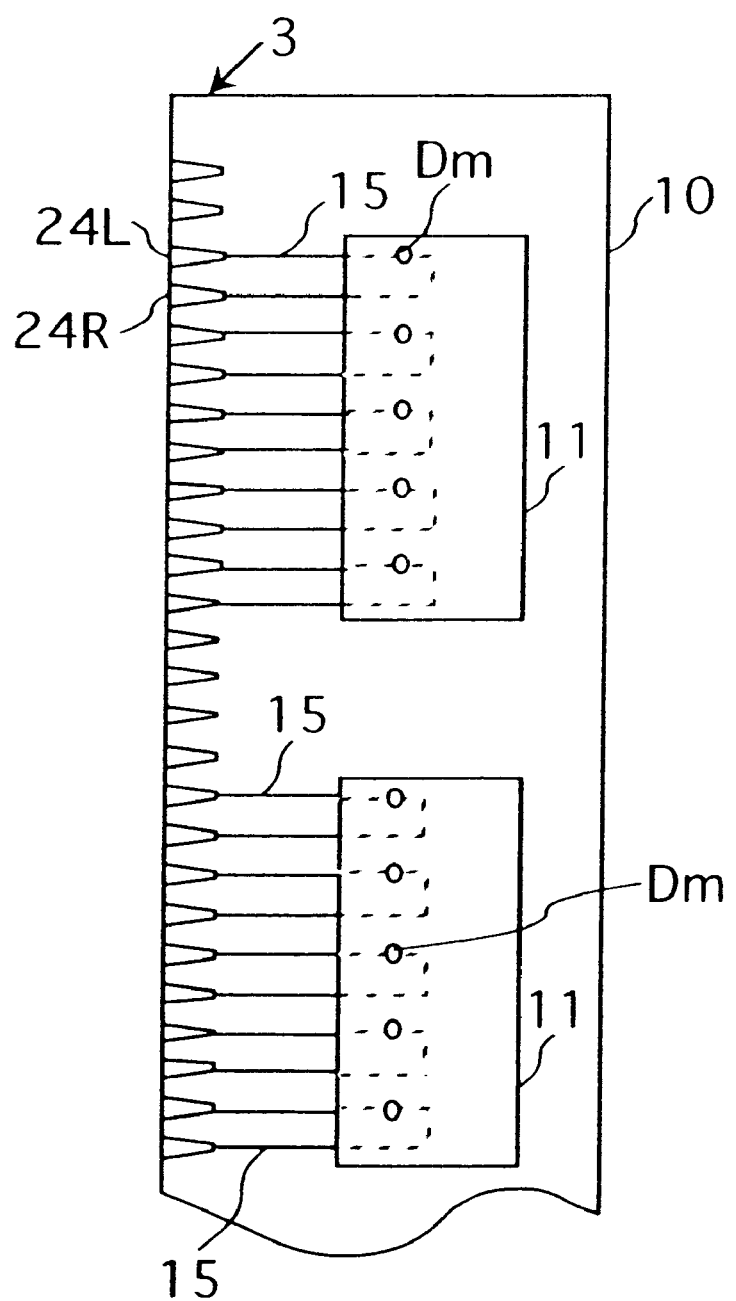
FIG. 22 is a plan view of a third memory module according to the present invention.

FIG. 22 is a plan view of a third memory module according to the present invention. In the memory module 3 shown in the same drawing, module data terminal pairs 24L and 24R are placed so as to adjoin each other on the same surface and side of a module substrate 10. The terminal pairs 24L and 24R are respectively connected to one another by module data wirings 15 laid down on a return or reciprocating basis and thereafter connected to memory data terminals Dm of one memory chip 11 on a one-stroke writing basis in the course of the module data wirings 15.

Figure 23A:
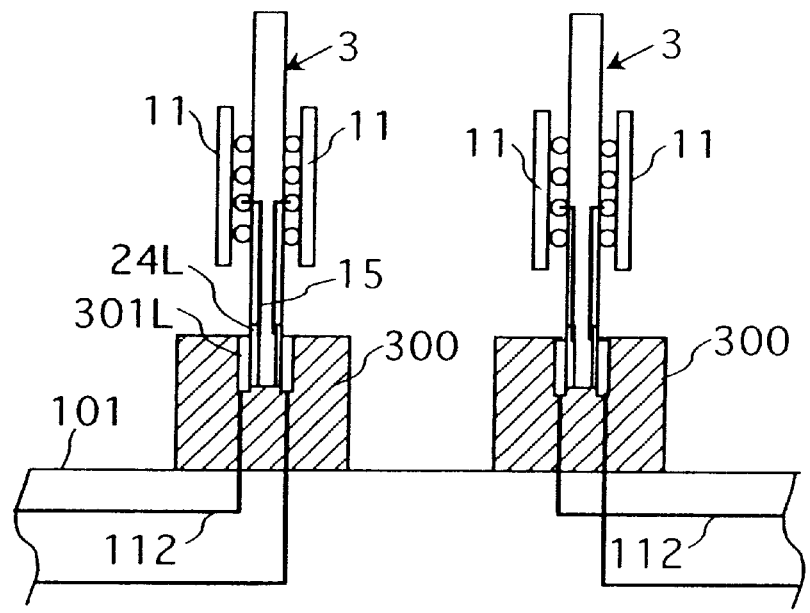
FIGS. 23A and 23B are respectively cross-sectional views illustrating, as examples, forms in which the third memory modules are connected to one another by connectors.
Figure 23B:
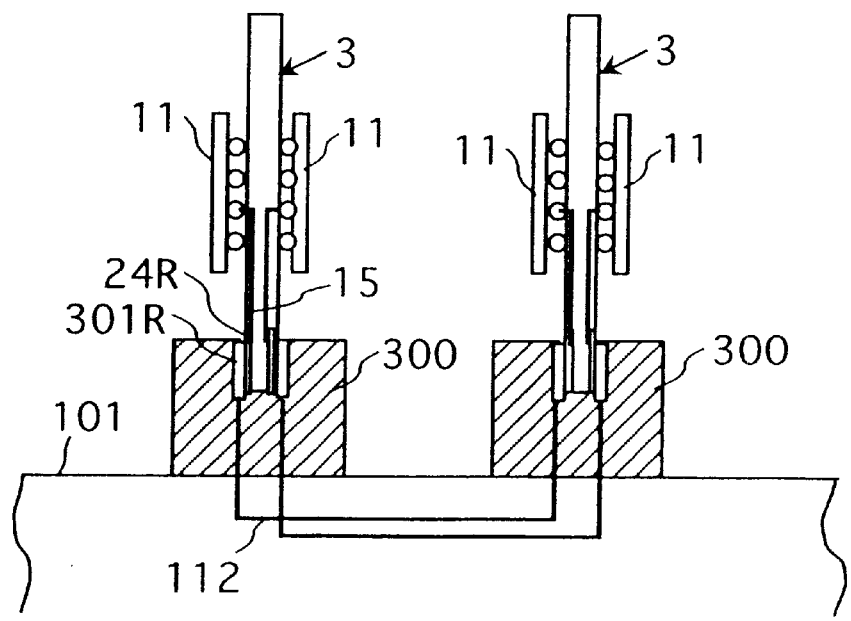

FIGS. 23A and 23B respectively illustratively show forms in which the third memory modules 3 are connected to one another by connectors. FIG. 23A is supposed as a vertical cross-sectional view at the position of each module data terminal 24L of FIG. 22, whereas FIG. 23B is assumed as a vertical cross-sectional view at the position of each module data terminal 24R of FIG. 22. In FIG. 23A, data signal wirings 112 are connected to their corresponding module data wirings 15 of each memory module 3 through data connector terminals 301L and module data terminals 24L of each connector 300 as viewed from a motherboard 101. The module data wirings 15 include paths folded back on a module substrate 10. Further, the module data wirings 15 reach the module data terminals 24R adjacent to the module data terminals 24L and are made conductive to their corresponding data signal wirings 112 of a motherboard 101 as viewed from data connector terminals 301R of the connectors 300 as illustrated in FIG. 23B by way example. While a form for connection to a power wiring 108 on the motherboard 101 is not illustrated in particular, the power terminal 108 of the motherboard 101 may be connected to its corresponding module power terminal of each memory module 3 through the connector in a manner similar to FIG. 21B.

Even in the case of the third memory module 3 in the same manner as described above, each memory chip can electrically be connected to the data signal wirings without creating branching and causing an increase in wiring length.

<<Dummy Memory Module>>

Figure 24:
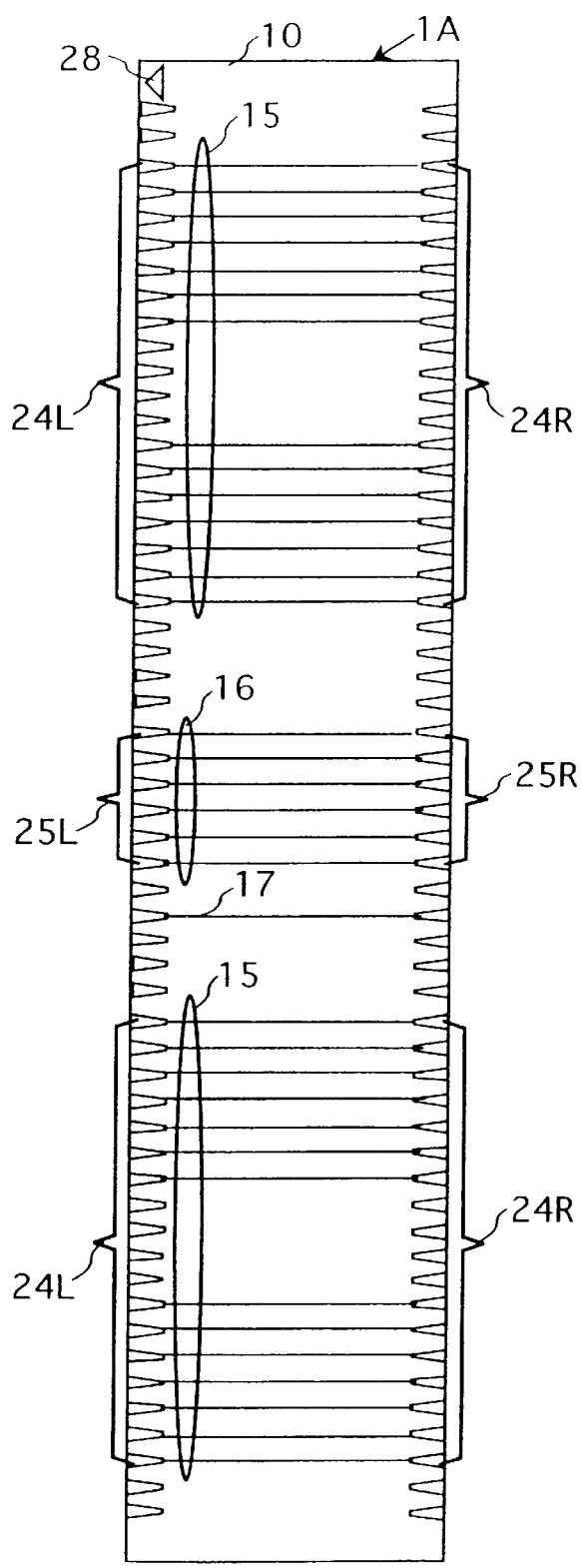
FIG. 24 is a plan view of a dummy memory module available together with the first memory module.
Figure 25:
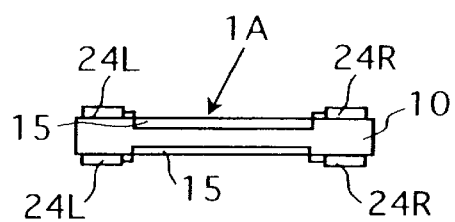
FIG. 25 is a side view of the dummy memory module shown in FIG. 24.

FIG. 24 is a plan view of a dummy memory module 1A available together with the first memory module 1, and FIG. 25 is a side view of the dummy memory module, respectively. The dummy memory module 1A shown in the same drawing has a configuration in which the memory chips 11, command/address buffer chip 12, PLL chip 13, module command/address distribution wirings 19, module clock distribution wiring 20 and terminating resistors 22 and 23 are omitted from the memory module 1 shown in FIG. 1. In other words, the dummy memory module 1A has module terminal pairs typified by 24L and 25R, module data wirings 15, module command/address wirings 16, and a module clock wiring 17 provided on a module substrate 10. If the dummy memory module 1A shown in FIG. 24 is mounted in its corresponding connectors 104A and 104B in place of the memory module 1 in the memory system described in FIGS. 5 and 4, then the memory capacity of the memory system can be changed without producing branching in the paths of the signal wirings 112, 113 and 117 and causing an increase in wiring length.

Although not illustrated in particular, if dummy capacities having reproduced input capacities of chips 11, 12 and 13 are provided for the wirings 15, 16 and 17 on the dummy memory module 1A, then the disturbance of each waveform can further be restrained without disturbing effective characteristic impedance.

FIGS. 26A, 26B and 26C respectively show a dummy memory module 2A available together with the second memory module 2, in which FIG. 26A is a cross-sectional view taken along line a—a, FIG. 26B is an enlarged surface view, and FIG. 26C is an enlarged back side view, respectively. The dummy memory module 2A shown in FIG. 26A has a configuration in which devices such as the memory chips 11, etc. are omitted from the memory module 2 shown in FIG. 19A. In short, the dummy memory module 2A comprise module terminal pairs typified by 24L and 25R, module wirings typified by 15, and through holes 200 for the module wirings, which are provided on the surface and back surface of the module substrate 10. If the dummy memory module 2A is used in place of the memory module 2 in the memory system shown in FIG. 21, then the memory capacity of the memory system can be changed without developing branching and causing an increase in wiring length.

Figure 27:
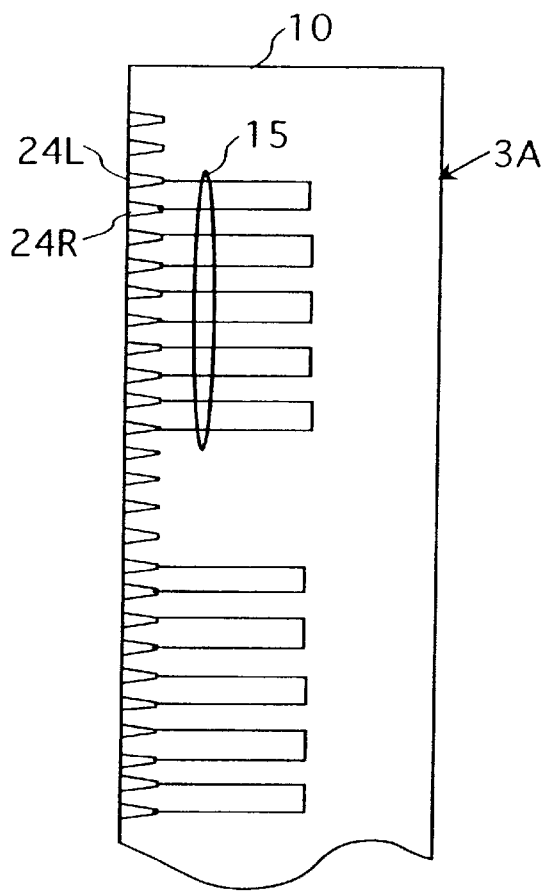
FIG. 27 is a plan view of a dummy memory module available together with the third memory module.

FIG. 27 shows a dummy memory module 3A available together with the third memory module 3. The memory module 3A shown in the same drawing has a configuration in which devices such as memory chips 11, etc. are omitted from the memory module 3 shown in FIG. 22. In short, the dummy memory module 3A comprise module terminal pairs typified by 24L and 25R, and module wirings typified by 15, which are provided on the surface of a module substrate 10. If the dummy memory module 3A is used in place of the third memory module 3, then the memory capacity of the memory system can be changed without developing branching and causing an increase in wiring length.

<<Memory Module for Termination>>

Figure 28A:
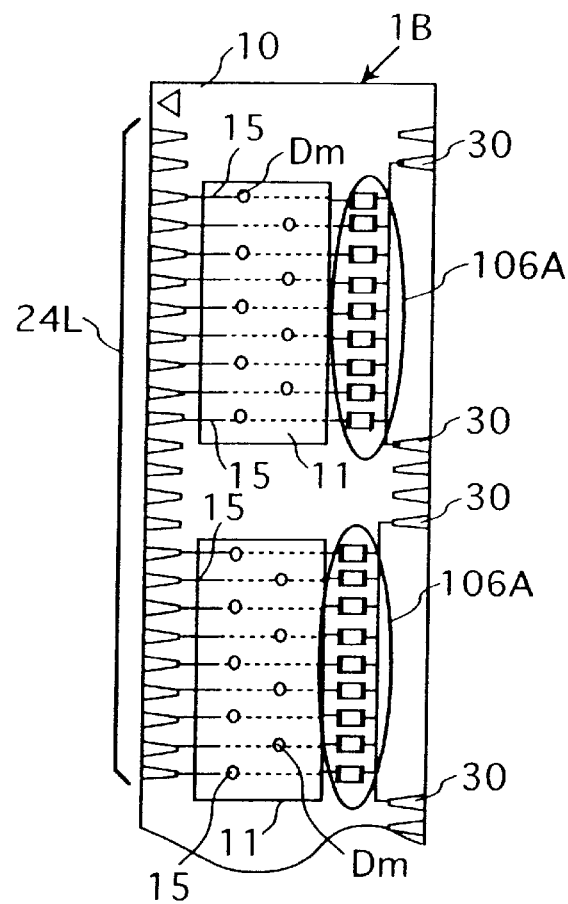
FIGS. 28A and 28B are respectively explanatory views of a terminating memory module in which the first memory module is equipped with terminating resistors.
Figure 28B:
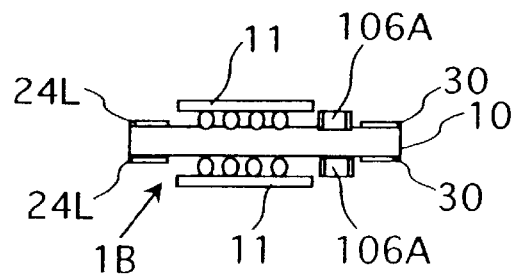

FIGS. 28A and 28B respectively show a memory module 1B for termination, wherein the first memory module 1 is equipped with terminating resistors, wherein FIG. 28A is a partly plan view, and FIG. 28B is a side view, respectively. The memory module 1B shown in FIG. 28A has a configuration in which one module terminals 24R of the module terminal pairs 24L and 24R or the like are removed, terminating resistors 106A are respectively connected to module data wirings 15 connected to the remaining module terminals 24L or the like, and terminating power terminals 30 are connected to the terminating resistors 106A. The back side of a module substrate 10 is also configured in the same manner as described above as shown in FIG. 28B.

Figure 29:
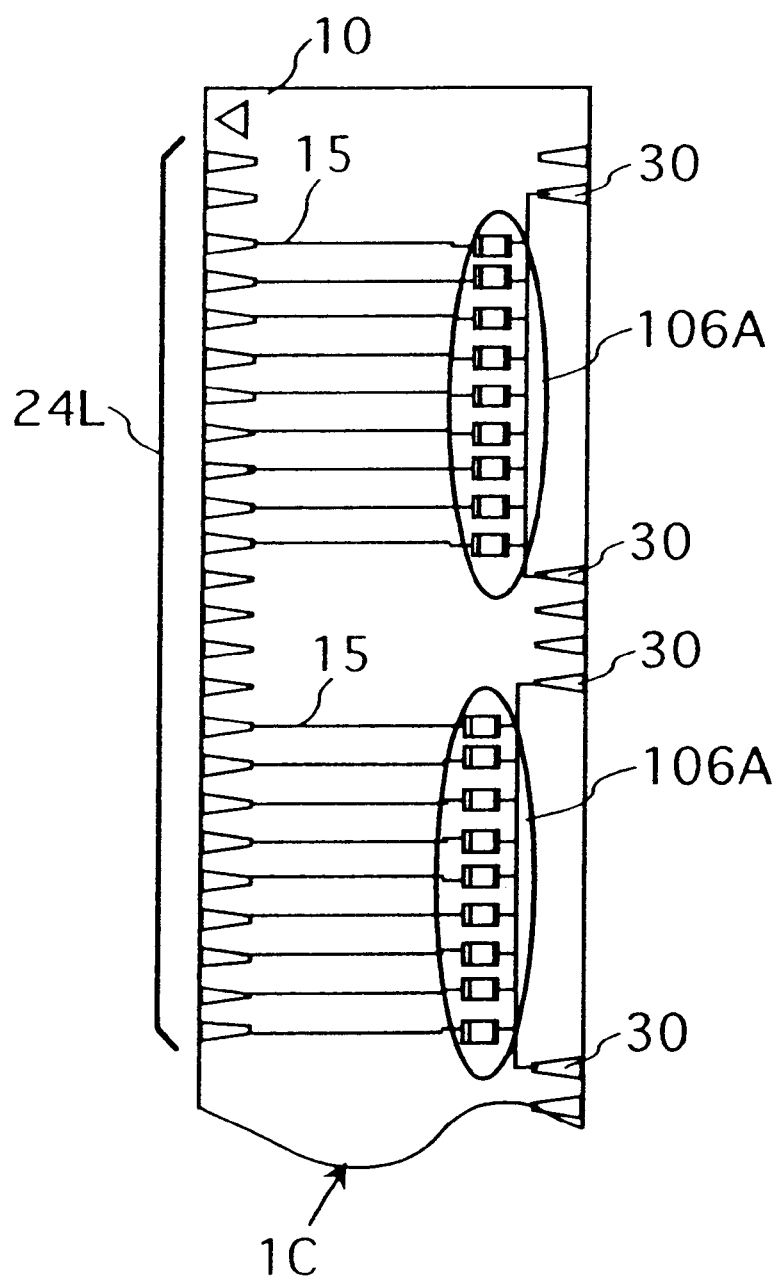
FIG. 29 is an explanatory view of a terminating dummy memory module which corresponds to the dummy memory module shown in FIG. 24.

FIG. 29 shows a dummy memory module 1C for termination, which corresponds to the dummy memory module 1A shown in FIG. 24. The present dummy memory module 1C has a configuration in which one module terminals 24 or the like of the module terminal pairs 24L and 24R or the like are omitted from the dummy memory module shown in FIG. 24, terminating resistors 106A are connected to their corresponding module data terminals 15 or the like connected to the remaining module terminals 24L or the like, and terminating power terminals 30 are connected to their corresponding terminating resistors 106A.

If either the memory module 1B shown in FIG. 28 or the memory module 1C shown in FIG. 29 is used in place of the memory module 1 in the memory system shown in FIG. 4, then the signal wirings 112, 113 and 117 on the motherboard 101 can be terminated on the memory module without having to use the terminating resistors 106 on the motherboard 101.

Figure 30A:
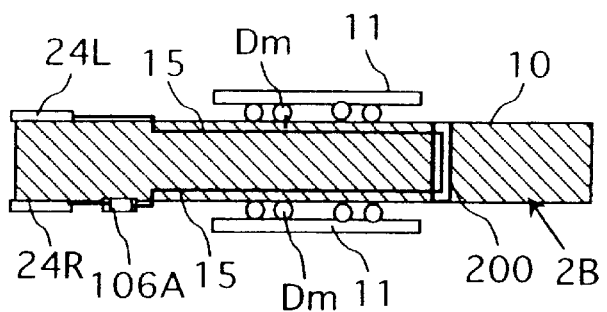
FIGS. 30A, 30B and 30C are respectively explanatory views of a terminating memory module in which the memory module shown in FIG. 19A is equipped with terminating resistors.
Figure 30B:
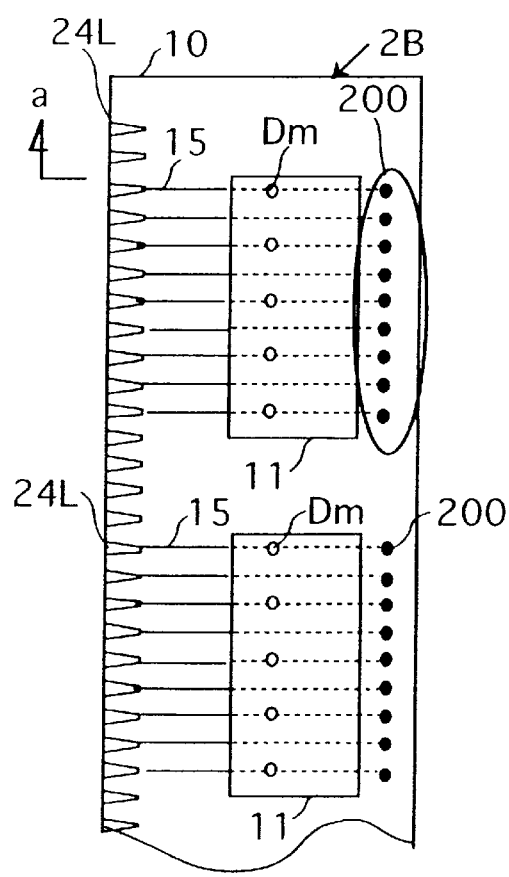
Figure 30C:
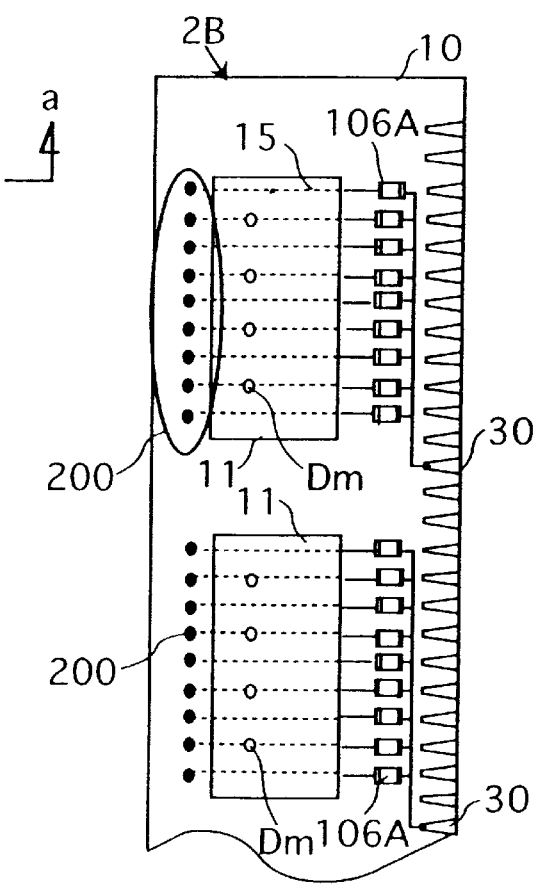

FIGS. 30A, 30B and 30C respectively show a memory module 2B for termination, in which the memory module 2 shown in FIG. 19A is equipped with terminating resistors, wherein FIG. 30A is a cross-sectional view taken along line a—a, FIG. 30B is an enlarged surface view, and FIG. 30C is an enlarged back side view, respectively. The memory module 2B shown in FIG. 30A has a configuration in which one module terminals 24R or the like of the module terminal pairs 24L and 24R or the like shown in FIG. 19A are removed, terminating resistors 106A are connected to their corresponding module data wirings 15 connected to the remaining module terminals 24L or the like, and terminating power terminals 30 are connected to the terminating resistors 106A.

If the memory module 2B for termination is used in place of the memory module 2 in the memory system shown in FIGS. 21A and 21B, then the signal wirings 112 can be terminated on the memory module without having to use the terminating resistors 106 on the motherboard 101. Other signal wirings 113 and 117 can also adopt a similar configuration respectively.

Figure 31:
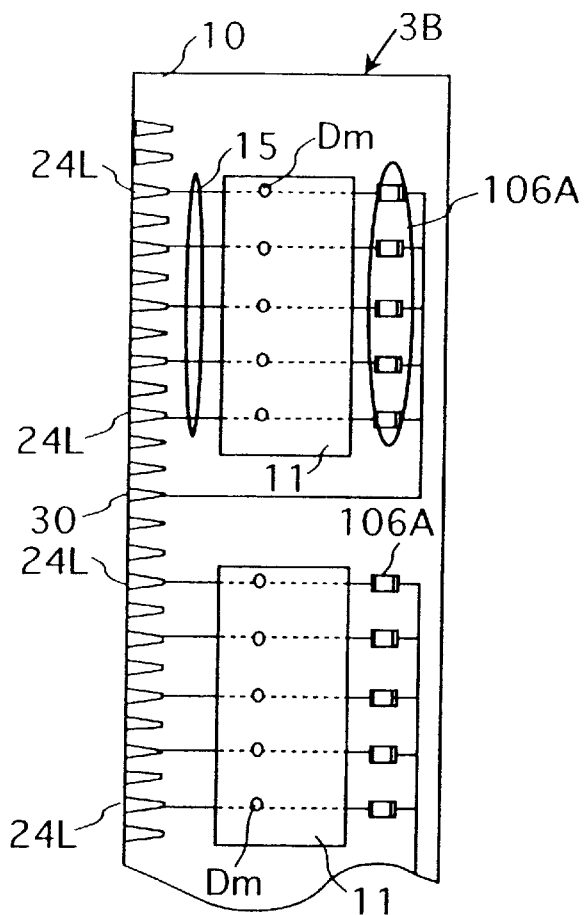
FIG. 31 is an explanatory view of a terminating memory module in which the memory module shown in FIG. 22 is equipped with terminating resistors.

FIG. 31 shows a memory module 3B for termination, in which the memory module 3 shown in FIG. 22 is equipped with terminating resistors. The memory module 3B shown in FIG. 31 has a configuration in which one module terminals 24R or the like of the module terminal pairs 24L and 24R or the like shown in FIG. 22 are removed, terminating resistors 106A are connected to their corresponding module data wirings 15 connected to the remaining module terminals 24L or the like, and terminating power terminals 30 are connected to the terminating resistors 106A. If the memory module 3B for termination is used in place of the memory module 3 shown in FIG. 22, then the signal wirings 112 and the like can be terminated on the memory module without having to use the terminating resistors 106 on the motherboard 101.

<<Other Forms of Connectors>>

Figure 32:
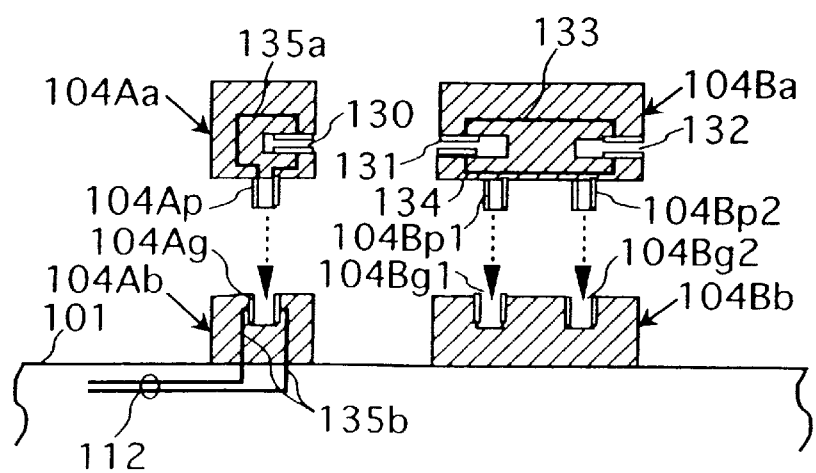
FIG. 32 is a cross-sectional view showing other forms related to the connectors shown in FIGS. 7 and 8 with attention to a data signal wiring portion.
Figure 33:
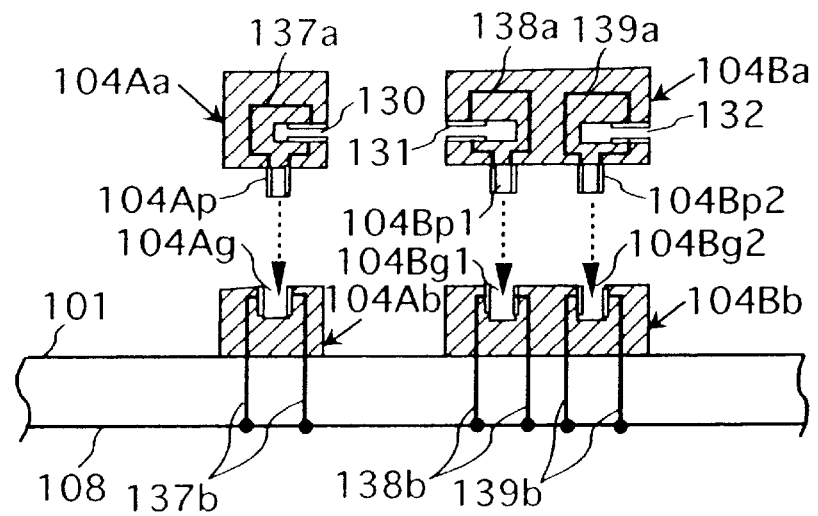
FIG. 33 is a cross-sectional view illustrating other forms related to the connectors shown in FIGS. 7 and 8 with attention to a power wiring portion.

FIGS. 32 and 33 respectively illustrate other forms of the connectors 104A and 104B shown in FIGS. 7 and 8 by way of example. FIG. 32 shows a portion connected to data signal wirings 112 in the form of a cross section, and FIG. 33 shows portions connected to a power wiring 108 in the form of cross sections. Portions connected to command/address signal wirings 113 and a clock signal wiring 117 are configured as shown in FIG. 33, for example.

In short, the configurations shown in FIGS. 32 and 33 are formed in such a manner that the connectors 104A and 104B shown in FIGS. 7 and 8 are detachably configured in form divided into two as viewed in a vertical direction to thereby facilitate the attachment of the memory modules 1, 1A and 1B.

Namely, the connector 104A is divided into two of 104Aa and 104Ab. A single connector terminal portion 104Ap formed in projected form is provided at the bottom of the divided piece or part 104Aa. Further, a single connector terminal portion 104Ag formed in recessed form is provided on the upper surface of the divided part 104Ab. Similarly, two single connector terminal portions 104Bp1 and 104Bp2 formed in projected form are provided at the bottom of the divided part 104Ba, and two single connector terminal portions 104Bg1 and 104Bg2 formed in recessed form are provided on the upper surface of the divided part 104Bb.

In FIG. 32, data signal wirings 112 are capable of being conductive to their corresponding terminals of connector terminal sequences 130 by connector built-in wirings 135a and 135b at portions corresponding to the data signal wirings 112, of the connector terminal portions 104Ap and 104Ag. In FIG. 33, a power wiring 108 is capable of being conductive to its corresponding terminals of connector terminal sequences 130 by connector built-in wirings 137a and 137b at portions corresponding to the power wiring 108, of the connector terminal portions 104Ap and 104Ag. The connectors 104Aa and 104Ab connected to the command/address signal wirings 113 and the clock signal wiring 117 are also similar to FIG. 33.

Further, terminals corresponding to data signal wirings 112, of connector terminal sequences 131 and 132 in the divided part 104Ba of the connector 104B are mutually brought into conduction by connector built-in wirings 133 and 134 as shown in FIG. 32 and configured substantially in the same manner as FIG. 7. In FIG. 33, the power wiring 108 is capable of being conductive to the corresponding terminals of the connector terminal sequence 131 by connector built-in wirings 138a and 138b at portions corresponding to the power wiring 108, of the connector terminal portions 104Bp1 and 104Bg1. Similarly, the power wiring 108 is capable of being conductive to the corresponding terminals of the connector terminal sequence 132 by connector built-in wirings 139a and 139b at portions corresponding to the power wiring 108, of the connector terminal portions 104Bp2 and 104Bg2. The connectors 104Ba and 104Bb connected to the command/address signal wirings 113 and the clock signal wiring 117 are also similar to FIG. 33.

The operation of mounting memory modules to a memory system using the connectors shown in FIGS. 32 and 33 is as follows. For example, the connector terminal sequences 130 of the connector divided part 104Aa and the connector terminal sequences 131 of the connector divided part 104Ba are respectively coupled to the right and left module terminals of the memory module 1. Subsequently, the connector terminal sequences 132 of the connector divided part 104Ba and the connector terminal sequences 131 of the connector divided part 104Ba are coupled to the right and left module terminals of the next memory module 1. Thus, after the required number of memory modules are horizontally coupled in series, the connector terminal 104Ap of the connector divided part 104Aa connected to the memory module is connected to its corresponding connector terminal 104Ag of the connector divided part 104Ab. Further, the connector terminals 104Bp1 and 104Bp2 of the connector divided part 104Ba connected to the memory module are connected to their corresponding connector terminals 104Bg1 and 104Bg2 of the connector divided part 104Bb. Thus, since a space necessary for the operation of installation of each memory module takes only a space above the memory system, another device can be installed around the memory system or the memory system can be placed in a location surrounded by walls.

Figure 34:
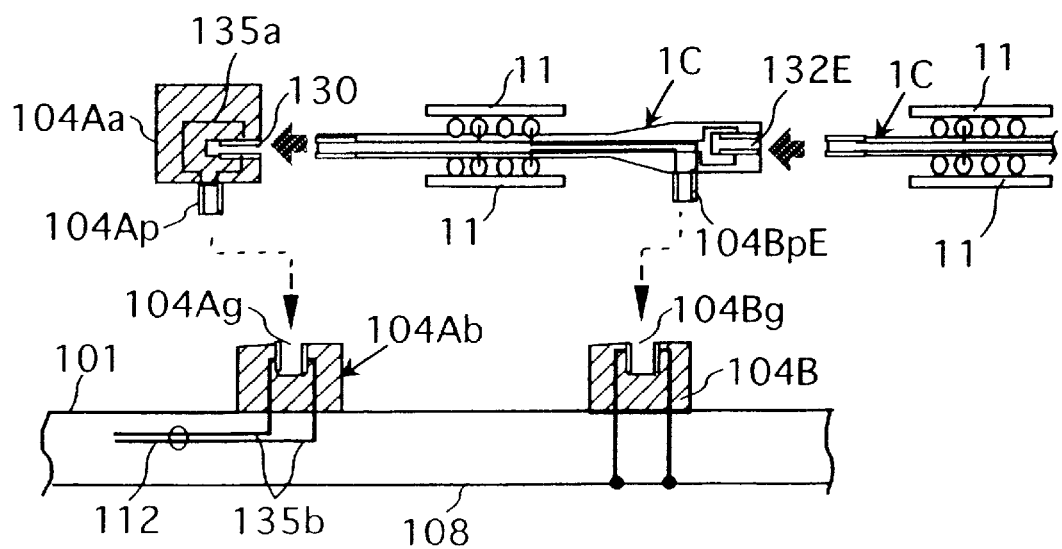
FIG. 34 is a cross-sectional view illustrating a memory module partly provided with connector functions.

FIG. 34 shows an example of a memory module partly provided with connector's functions. The memory module 1C shown in the same drawing takes a configuration in which connector terminal sequences 132E respectively having functions equivalent to the connector terminal sequences 132 shown in FIG. 33 and a connector terminal portion 104BpE having a function equivalent to the connector terminal portion 104Bp2 are added to the memory module 1 shown in FIG. 1. The connector terminal sequences 132E are connected to their corresponding module data wirings 15, and the connector terminal portion 104BpE is connected to the corresponding module power wirings, module command/address wirings 16 and module clock wiring 17. A connector 104B is placed on a motherboard 101 in association with the connector terminal portion 104BpE. Owing to the configuration shown in FIG. 34, the quantity of work for connecting the memory modules to the motherboard can be reduced as compared with the configurations shown in FIGS. 32 and 33. Further, the number of parts employed in the memory system can be reduced. This configuration is also considered to be capable of contributing to a reduction in the cost of the memory system.

Figure 35:
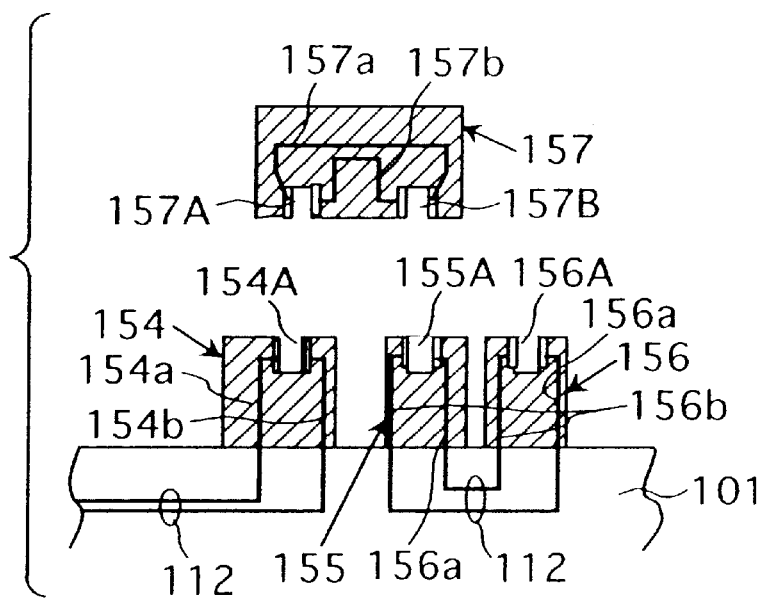
FIG. 35 is a cross-sectional view showing connectors corresponding to other forms applicable to a memory module with attention to a data signal wiring portion.

FIG. 35 shows portions at which connectors corresponding to other forms applicable to the memory module 1 are connected to their corresponding data signal wirings 112, in the form of cross sections. Connectors 154, 155 and 156 respectively have connector terminals 154A, 155A and 156A formed in upward recessed trenches and are capable of allowing the memory module 1 to uprise and supporting it. A connector 157 has connector terminals 157A and 157B formed in downward recessed trenches and allows a pair of vertically-set memory modules 1 to be inserted therein. The data signal wirings 112 on a motherboard 101 are connected to a connector terminal 154A through in-connector wirings 154a and 154b, a connector terminal 155A through in-connector wirings 155a and 155b, a connector terminal 156A through in-connector wirings 156a and 156b, and connector terminals 157A and 157B through in-connector wirings 157a and 157b, respectively. Thus, when the memory modules 1 are mounted in the connectors 154, 155 and 157, the wirings 154a, 157a and 156a are made conductive to their corresponding data signal wirings 112, and the wirings 154b, 157b and 156b are made conductive to their corresponding data signal wirings 112. The memory modules 1 are capable of being conductive to the data signal wirings 112 without having branching.

Figure 36:
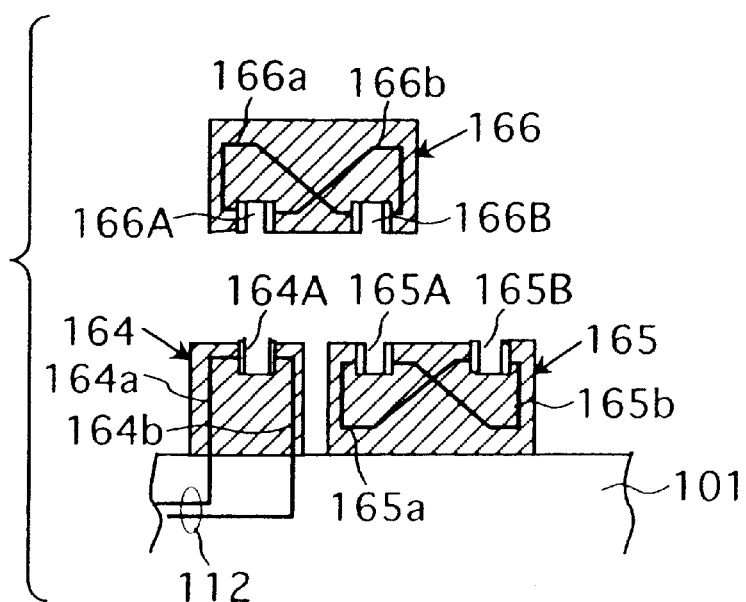
FIG. 36 is a cross-sectional view illustrating connectors corresponding to other forms applicable to a memory module with attention to a data signal wiring portion.

FIG. 36 shows portions at which connectors corresponding to further forms applicable to the memory module 1 are connected to their corresponding data signal wirings 112, in the form of cross sections. A connector 164 has a connector terminal 164A formed in an upward recessed trench. A connector 165 has connector terminals 165A and 165B formed in upward recessed trenches and is capable of allowing the memory module 1 to uprise and supporting it. A connector 166 has connector terminals 166A and 166B formed in downward recessed trenches and allows a pair of vertically-set memory modules 1 to be inserted therein. The data signal wirings 112 on a motherboard 101 are connected to the connector terminal 164A through in-connector wirings 164a and 164b. The connector terminals 165A and 165B are connected to each other through in-connector wirings 165a and 165b. The connector terminals 166A and 166B are connected to each other through in-connector wirings 166a and 166b. Thus, when the memory modules 1 are mounted in the connectors 164, 165 and 167, the wirings 164a, 166a and 165a are made conductive to their corresponding data signal wirings 112, and the wirings 164b, 166b and 165b are made conductive to their corresponding data signal wirings 112. The memory modules 1 are capable of being conductive to the data signal wirings 112 without having branching.

Figure 37:
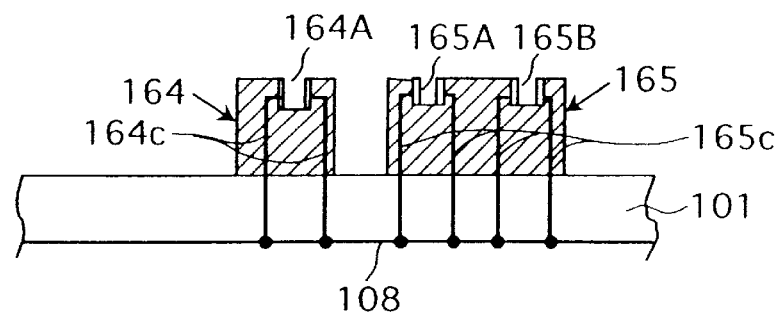
FIG. 37 is a cross-sectional view showing the connectors shown in FIG. 36 with attention to a power wiring portion.

FIG. 37 shows a cross section of a power wiring portion associated with the connectors shown in FIG. 36. A power wiring 108 on a motherboard 101 branches off in the course thereof, which in turn are connected to corresponding power terminals of the connector terminals 164A and 165A through in-connector wirings 164c and 165c.

Figure 38:
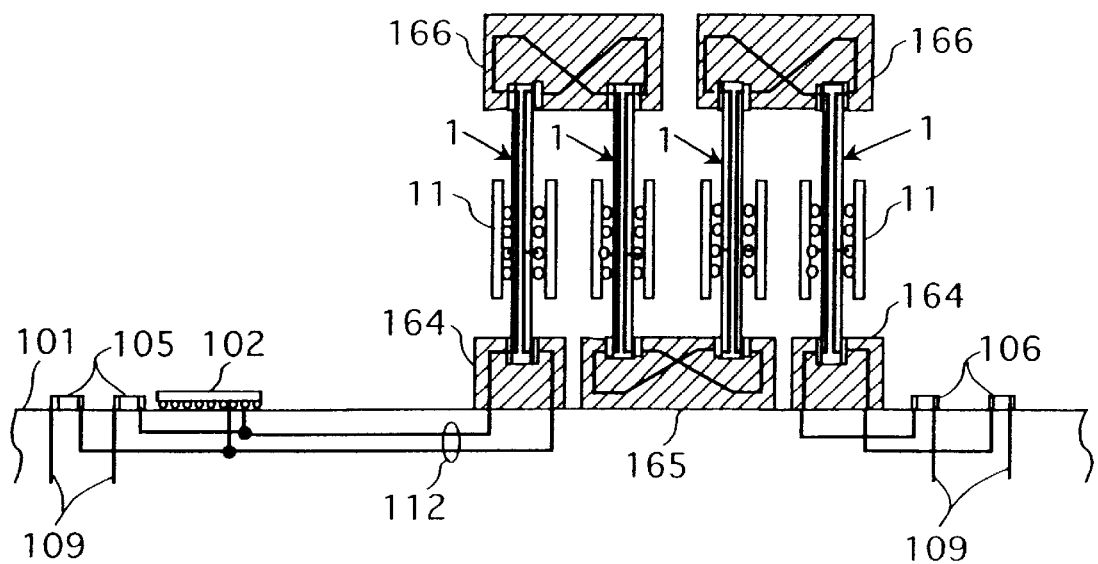
FIG. 38 is a cross-sectional view depicting a state in which memory modules are respectively mounted in the connectors shown in FIGS. 36 and 37.

FIG. 38 shows a state in which memory modules are mounted in the connectors shown in FIGS. 36 and 37. If the connectors 164 through 166 are used, the a memory system for connecting memory elements to their corresponding data signal wirings can be formed on a motherboard in a small occupied area without creating branching and causing an increase in wiring length. This is identical even when the connectors 154 through 157 shown in FIG. 35 are used. Even in relation to the connections of command/address signal wirings 113 and a clock signal wiring 117, the connectors shown in FIG. 35 or 36 may be used.

<<Other Forms of Memory Module>>

Figure 39A:
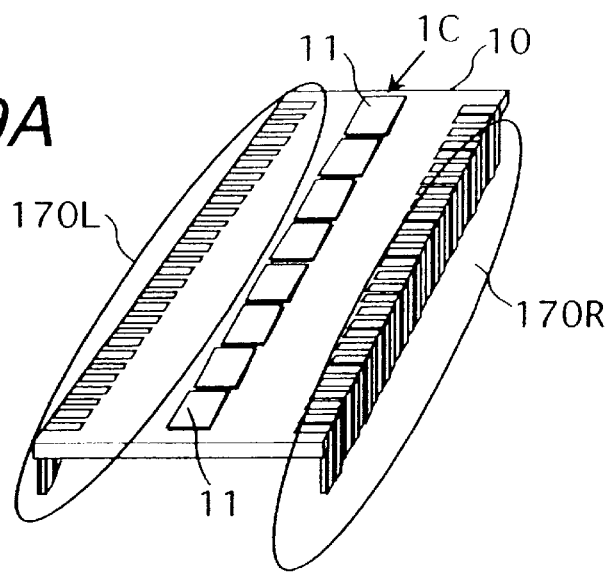
FIGS. 39A and 39B are respectively perspective views showing a further embodiment of a memory module provided with a module terminal pair extending in a downward direction.
Figure 39B:
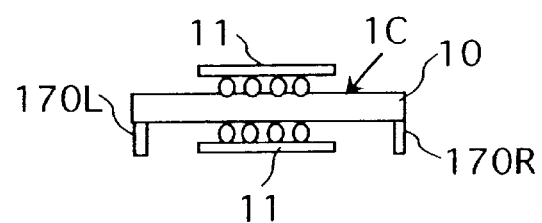

A perspective view of FIG. 39A and a side view of FIG. 39B respectively show a still further form of a memory module. The memory module 1C shown in the same drawings is different from the memory module 1 in that a module terminal pair 170L and 170R typified by the data terminal pair 24L and 24R is formed in a direction orthogonal to a module substrate 10.

Figure 40:
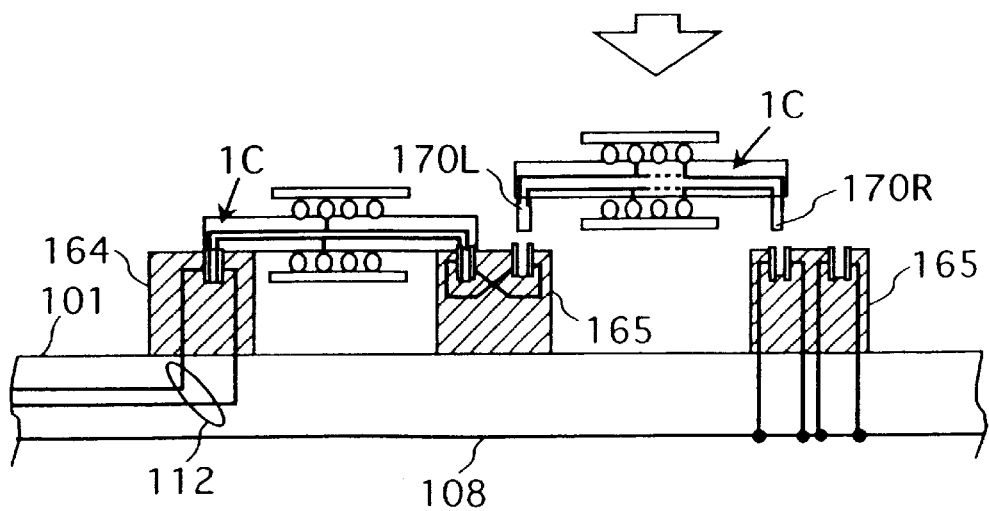
FIG. 40 is a cross-sectional view showing one example of a memory system equipped with the memory module shown in FIGS. 39A and 39B.

FIG. 40 shows one example of a memory system equipped with the memory modules shown in FIGS. 39A and 39B. Although not restricted in particular, the connectors 164 and 165 shown in FIG. 36 are used as connectors on a motherboard 101. The connectors 154, 155 and 156 or the like shown in FIG. 35 may be used. Since the connector 166 shown in FIG. 36 and the connector 157 shown in FIG. 35 become unnecessary and a space necessary for the work of installation of each memory module is directed only above the memory system, another device can be installed around the memory system or the memory system can be installed in a location surrounded by walls.

Figure 41:
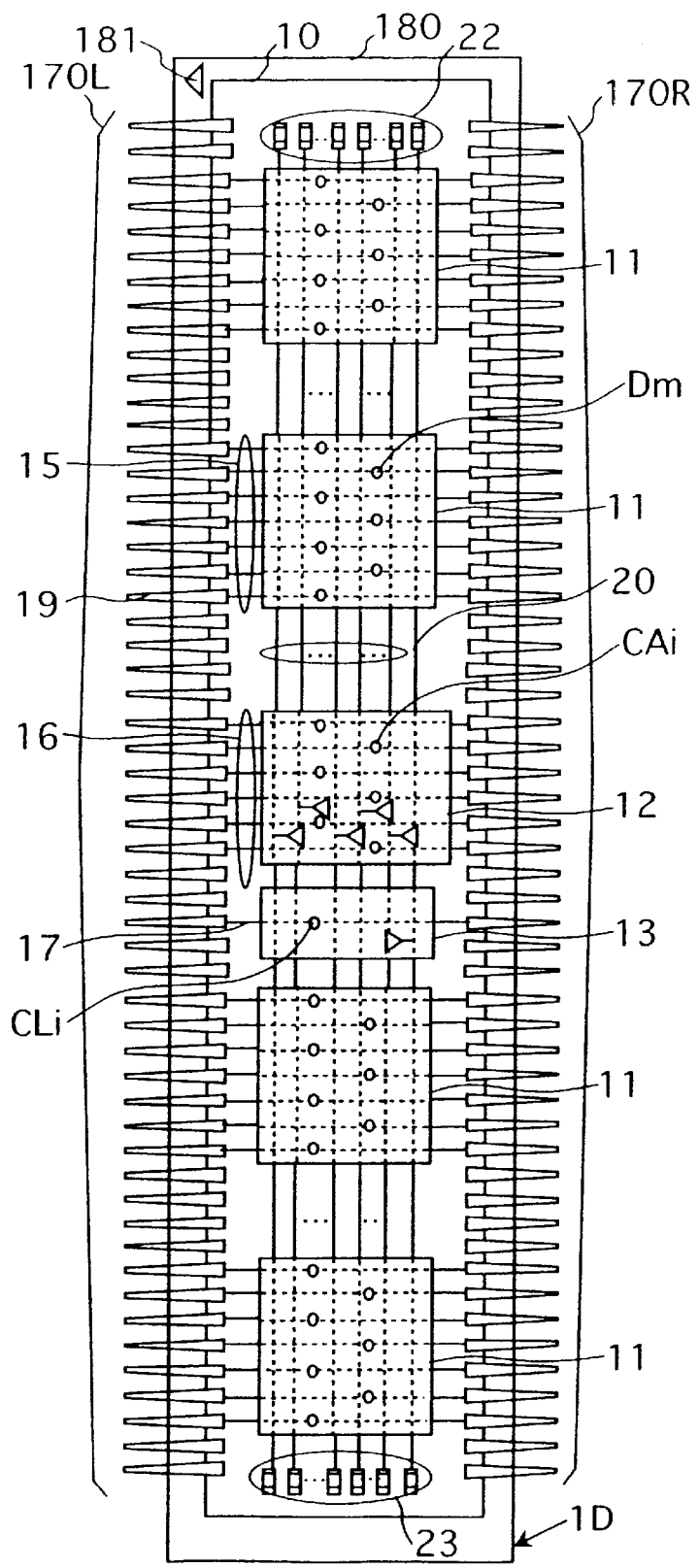
FIG. 41 is a plan view of a memory module having a package-based sealing structure.
Figure 42:
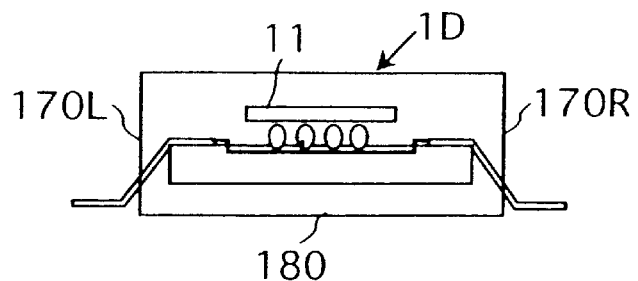
FIG. 42 is a side view of the memory module shown in FIG. 41.

FIGS. 41 and 42 show a still further example of a memory module. The memory module 1D shown in the same drawings has a configuration in which only the configuration on one surface of the memory module 1 is formed on a memory module 10, the entirety of the memory module is sealed with a package 180 such as a resin, and module terminals 170R and 170L are withdrawn from the package 180 to the outside as lead terminals. A mark 181 for supporting the direction of installation of the package is attached to the package. Since semiconductor chips such as the memory chips 11 are protected by the package 180 in the memory module 1D, the semiconductor chips are hard to break down upon handling of the memory module 1D. The memory module 1D is hard to be subjected to the influence of external moisture and dust, and the durability thereof is improved. Incidentally, the package-based encapsulating or sealing structure can naturally be applied even to the memory modules having other configurations.

Figure 43A:
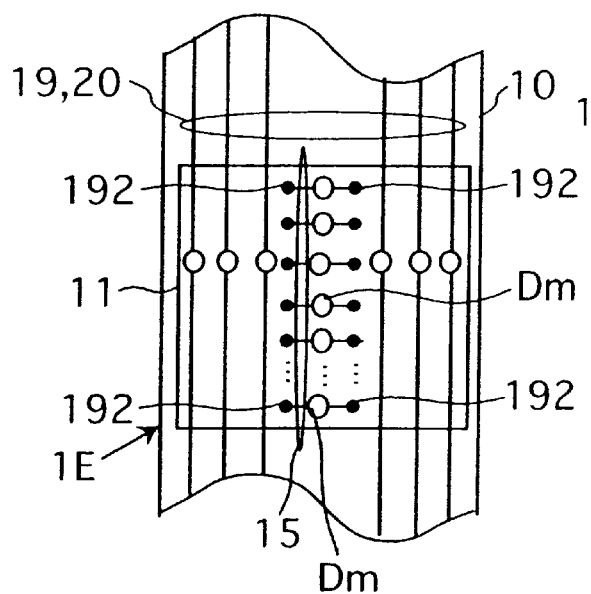
FIGS. 43A, 43B, 43C and 43D are respectively explanatory views of a memory module having module terminals provided in a central portion of a module substrate.
Figure 43B:
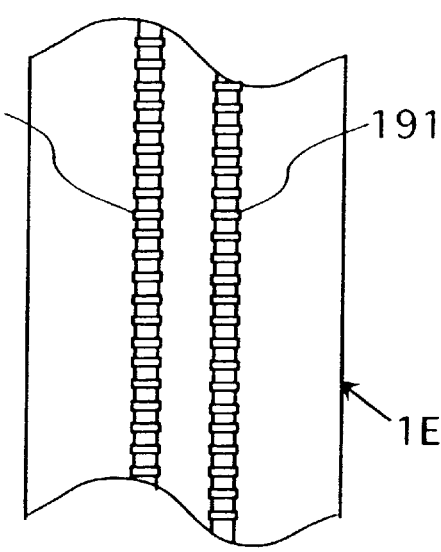
Figure 43C:
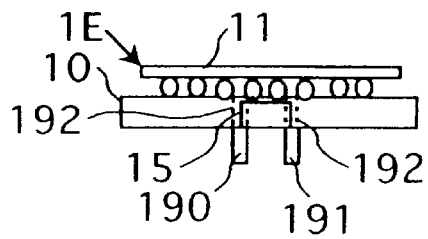
Figure 43D:
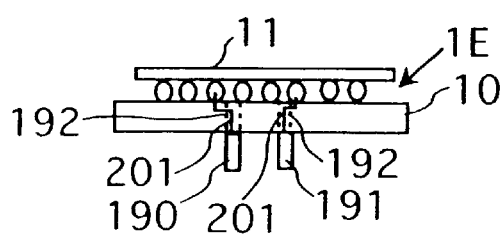

FIGS. 43A, 43B, 43C and 44D respectively show a still further form of a memory module. The memory module 1E shown in FIG. 43A has terminals 190 and 191 provided on a substrate back. Further, the memory module 1E has through holes 192 defined inside a module substrate 10 and through which wirings lying on the back of the module substrate 10 pass. Module data signal wirings 15 connect terminals 190 and 191 to one another as shown in FIG. 43C and are connected to each memory chip 11 on the surface of the module substrate 10 through substantially one-stroke writable wiring paths in the course thereof. Further, power wirings 201 may not be connected by one-stroke writable wiring paths as shown in FIG. 43D. Incidentally, module command/address wirings 16 for a command/address register buffer chip 12 and a module clock wiring 17 for a PLL chip 13 may also be configured in a manner similar to the data signal wirings 15 or power wirings 201.

FIG. 44 is a cross-sectional view of a data signal wiring portion of a memory system using the memory modules 1E each shown in FIG. 43A, and FIG. 45 is a cross-sectional view of a power wiring portion of the memory system using the memory modules 1E each shown in FIG. 43A, respectively. As shown in the same drawing, a connector 195 is adopted in which vertical or elevation steps are provided between terminals, and an interval IT between terminals for connecting terminals for the adjacent memory modules 1E in the drawing is smaller than a width WM of each memory module. Further, data signal wirings 112 are wired without branching off between the signal terminals of the connector for connecting the signal terminals of the adjacent memory module 1E. A power wiring 108 branches off in the course thereof and is connected to each memory module 1E. Since the memory module 1E shown in FIG. 43 does not have branching at the data signal wirings 112, and the interval IT between the terminals for connecting the terminals of the adjacent memory modules 1E to one another is smaller than the width WM of each memory module 1E, a memory system can be implemented wherein a wiring length is set as short as possible and each memory chip 11 is connected to the corresponding data signal wirings 112.

FIG. 46 shows another layout form illustrative of module data wirings. Namely, a memory module 1F is provided with a module substrate 10 and a plurality of memory chips mounted along the longitudinal direction of the module substrate 10 and respectively having a plurality of chip connecting terminals. FIG. 46 illustrates chip data terminals Dm as the chip connecting terminals by way of example. The module substrate 10 has a plurality of module connecting terminals 24L and 24R provided in association with the chip data terminals Dm of the plurality of memory chips 11, and module data wirings 15 for connecting the module connecting terminals and the chip connecting terminals to one another. The module data wirings 15 bypass predetermined chip data terminals Dm of the linearly-located plural chip data terminals Dm so as to be connected to other predetermined chip data terminals Dm. According to the memory module 1F, the connections between the chip data connecting terminals Dm of each memory chip 11, which are vertically and horizontally placed in large numbers, and their corresponding module data wirings 15 can be implemented with relative ease.

While the invention made by the present inventors has been described above specifically based on the embodiments, the present invention is not limited to the embodiments. It is needless to say that various changes can be made thereto within the scope not departing from the substance thereof.

For example, a memory chip is not limited to a synchronous DRAM, and another storage type memory may be used in place of it. A memory system may be implemented by employing connectors having configurations other than those for the above-described connectors in memory modules.

A memory module according to the present invention is particularly effective for application to a personal computer, a work station, or a computer system requiring a large capacity memory, like a server.

Advantageous effects obtained by a typical one of the inventions disclosed in the present application will be described in brief as follows:

Namely, a memory module can be provided wherein the disturbance of each signal waveform due to signal reflection can be controlled to improve the reliability of signal transmission, and an increase in access time can be restrained.

If the memory module according to the present invention is applied to a computer system, then no signal waveform is disturbed even if the frequency of a memory system is increased, and data can be transmitted at high speed while latency is being controlled. It is therefore possible to increase the speed for processing data by a computer system.

We claim:

1. A memory module comprising:
   a module substrate; and a plurality of memory chips mounted on said module substrate and respectively having a plurality of chip data terminals, wherein said module substrate has a plurality of module data terminal pairs individually provided in association with the respective chip data terminals included in said plurality of memory chips, and a plurality of module data wirings which respectively connect between said plurality of module data terminal pairs, wherein said plurality of module data wirings are connected to their corresponding chip data terminals and are available as a memory access data bus, and wherein, each of said plurality of module data terminal pairs outputs a pair of signals which are to be received by a pair of outside socket terminals.

2. A memory module comprising:

a module substrate; and a plurality of memory chips mounted on said module substrate and respectively having a plurality of chip data terminals, wherein said module substrate has a plurality of module data terminal pairs individually provided in association with the respective chip data terminals included in said plurality of memory chips, and a plurality of module data wirings which respectively connect between said plurality of module data terminal pairs, wherein said plurality of module data wirings are respectively connected to the corresponding chip data terminals and are available as a memory access data bus, wherein said plurality of memory chips are chip-selected and controlled in parallel, and wherein, each of said plurality of module data terminal pairs outputs a pair of signals which are to be received by a pair of outside socket terminals.

3. The memory module according to claim 2, wherein said plurality of memory chips are arranged along the longitudinal direction of said module substrate, and said module data terminal pairs are placed at one long-side portion and the other long-side portion of each memory chip-mounted surface of said module substrate.

4. The memory module according to claim 2 or 3, wherein said plurality of memory chips are arranged along the longitudinal direction of said module substrate, and said module data wirings respectively extend from one long-side portion to the other long-side portion of each memory chip-mounted surface of said module substrate.

5. The memory module according to claim 2, wherein said plurality of memory chips are arranged along the longitudinal direction of said module substrate, and said module data terminal pairs are both placed at one long-side portion of said module substrate.

6. The memory module according to claim 5, wherein said module data wirings are formed back and forth within the same wiring layer and connected to their corresponding module data terminal pairs.

7. The memory module according to claim 5, wherein said module data wirings are formed in mutually-different wiring layers brought into conduction through holes defined between the wiring layers and are connected to their corresponding module data terminal pairs.

8. The memory module according to claim 7, wherein said memory chips are placed on both surfaces of said module substrate.

9. A memory module comprising:

a module substrate; and a plurality of memory chips mounted along the longitudinal direction of said module substrate and respectively having a plurality of chip data terminals and a plurality of chip address terminals, wherein said module substrate has a plurality of module data terminal pairs individually provided in association with the respective chip data terminals included in said plurality of memory chips, module address terminal pairs common to said plurality of memory chips, a plurality of module data wirings which respectively connect said plurality of module data terminal pairs in linear form, and module address wirings which connect said module address terminal pairs in linear form and which extend in intersecting directions and are commonly connected to said chip address terminals of said plurality of memory chips, wherein said plurality of module data wirings are connected to their corresponding chip data terminals and are available as a memory access data bus, and wherein, each of said plurality of module data terminal pairs outputs a pair of signals which are to be received by a pair of outside socket terminals.

* * * * *